United States Patent [19]
Endo

[11] Patent Number: 5,962,854
[45] Date of Patent: Oct. 5, 1999

[54] INFRARED SENSOR AND INFRARED DETECTOR

[75] Inventor: Haruyuki Endo, Tokyo, Japan

[73] Assignee: Ishizuka Electronics Corporation, Tokyo, Japan

[21] Appl. No.: 08/873,703

[22] Filed: Jun. 12, 1997

[30] Foreign Application Priority Data

Jun. 12, 1996 [JP] Japan ..................................... 8-151144
May 20, 1997 [JP] Japan ..................................... 9-129917

[51] Int. Cl.⁶ .................. G01J 5/20; G01J 5/24
[52] U.S. Cl. ........................ 250/349; 250/338.1
[58] Field of Search .................. 250/349, 338.4, 250/338.1; 338/18, 17

[56] References Cited

U.S. PATENT DOCUMENTS 5,302,933  4/1994  Kudo et al. .
5,397,897  3/1995  Komatsu et al. .
5,589,688  12/1996  Kimura et al. ........................ 250/338.4
5,825,029  10/1998  Agnese et al. ........................ 250/338.1

FOREIGN PATENT DOCUMENTS 2-201229  8/1990  Japan .
3-136379  6/1991  Japan .
3-136979  6/1991  Japan .
6-74820   3/1994  Japan ................................ 250/338.1
6-160174  6/1994  Japan .
7-65937   7/1995  Japan .

*Primary Examiner*—Constantine Hannaher
*Attorney, Agent, or Firm*—McDermott, Will & Emery

[57] ABSTRACT

A chip-shaped infrared sensor comprising a substrate formed with a cavity, an infrared radiation receiving portion supported in the form of a micro air bridge in the cavity by four hook-shaped beam portions extending from the substrate, two thermistor films for infrared radiation detection formed on the infrared radiation receiving portion, two thermistor films for temperature compensation arranged on the substrate, and a single thermistor film arranged on the substrate for detecting temperature of the substrate.

17 Claims, 21 Drawing Sheets

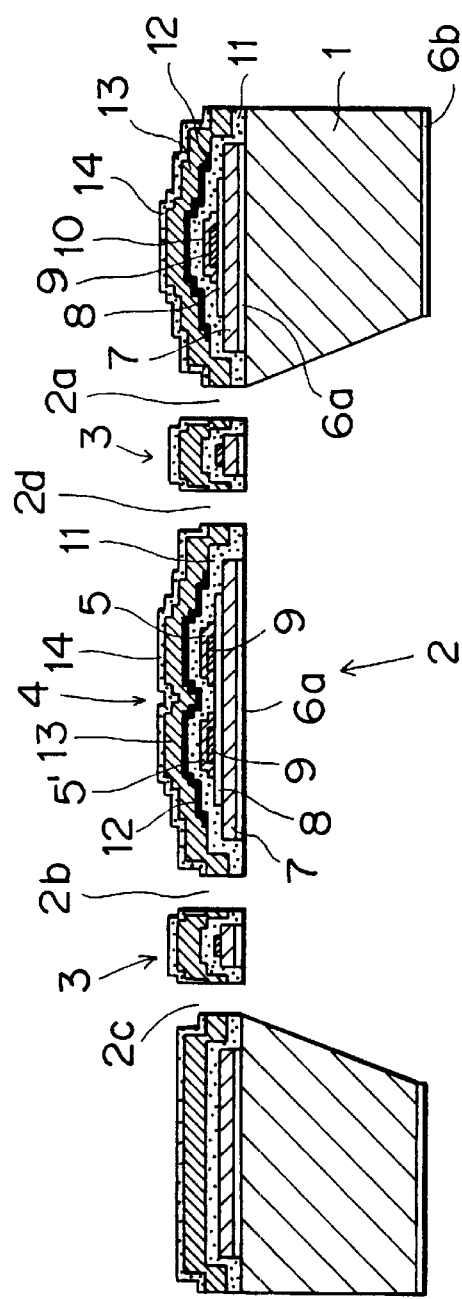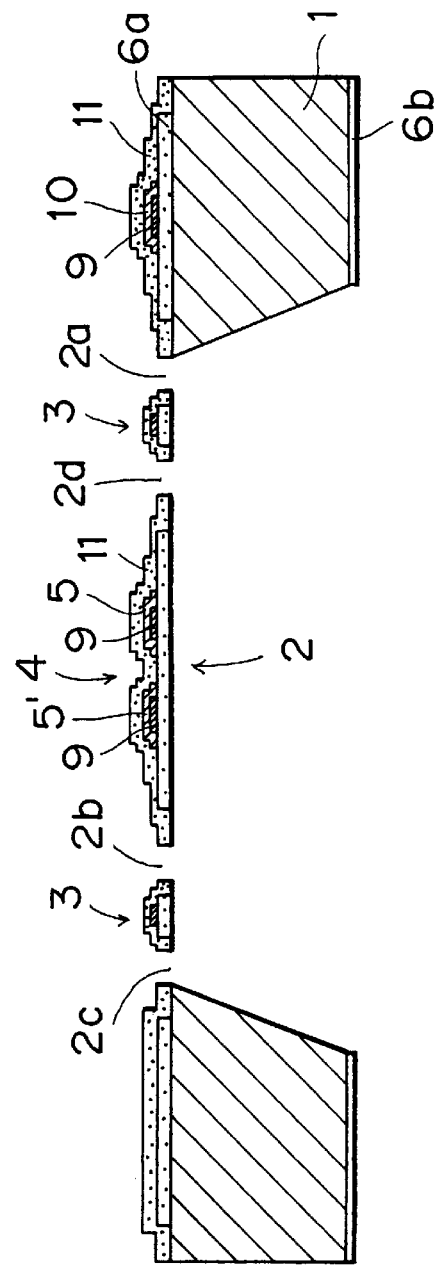

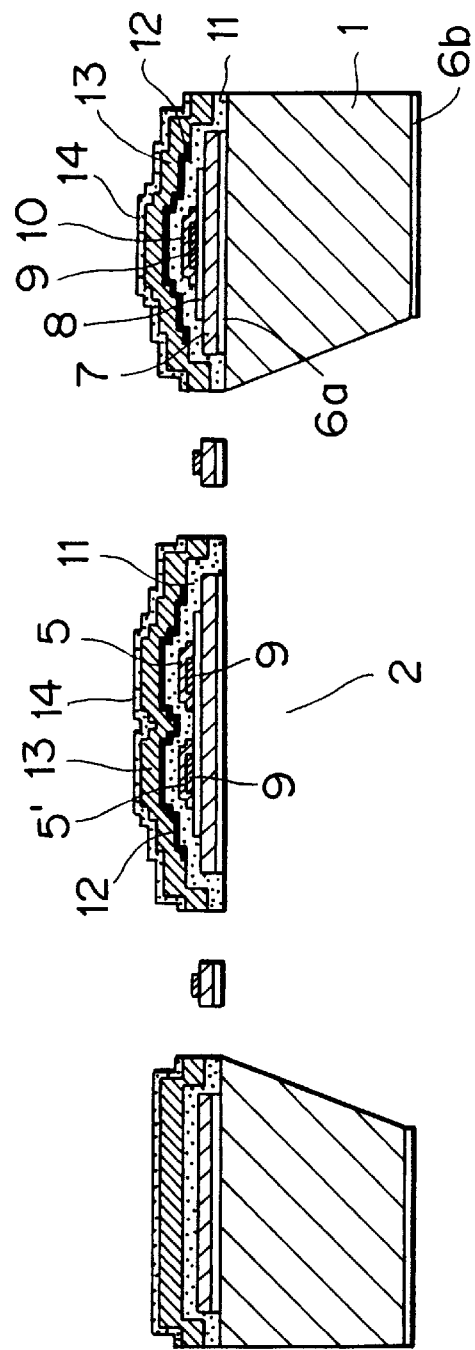
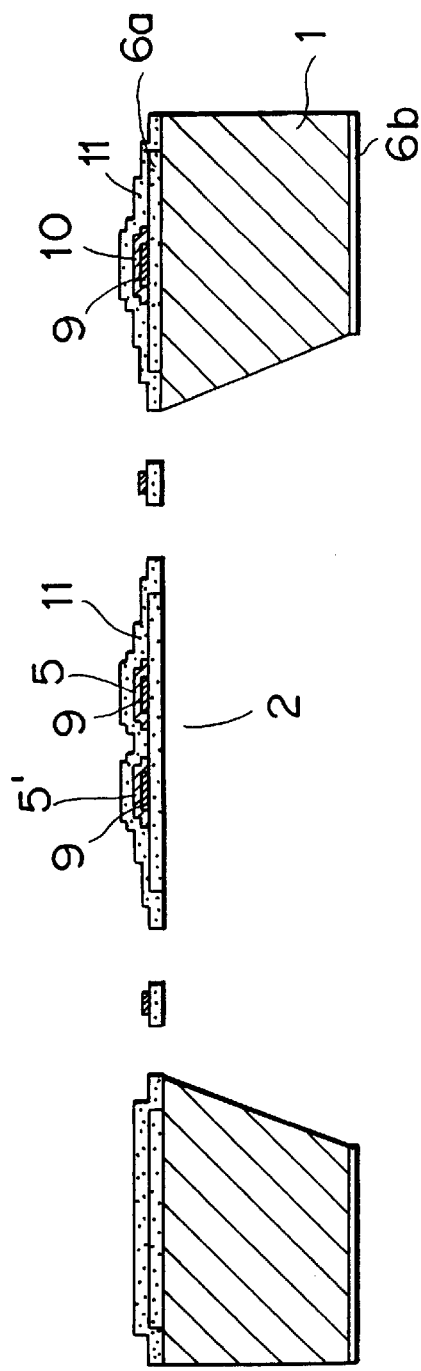
FIG. 3A
FIG. 3B

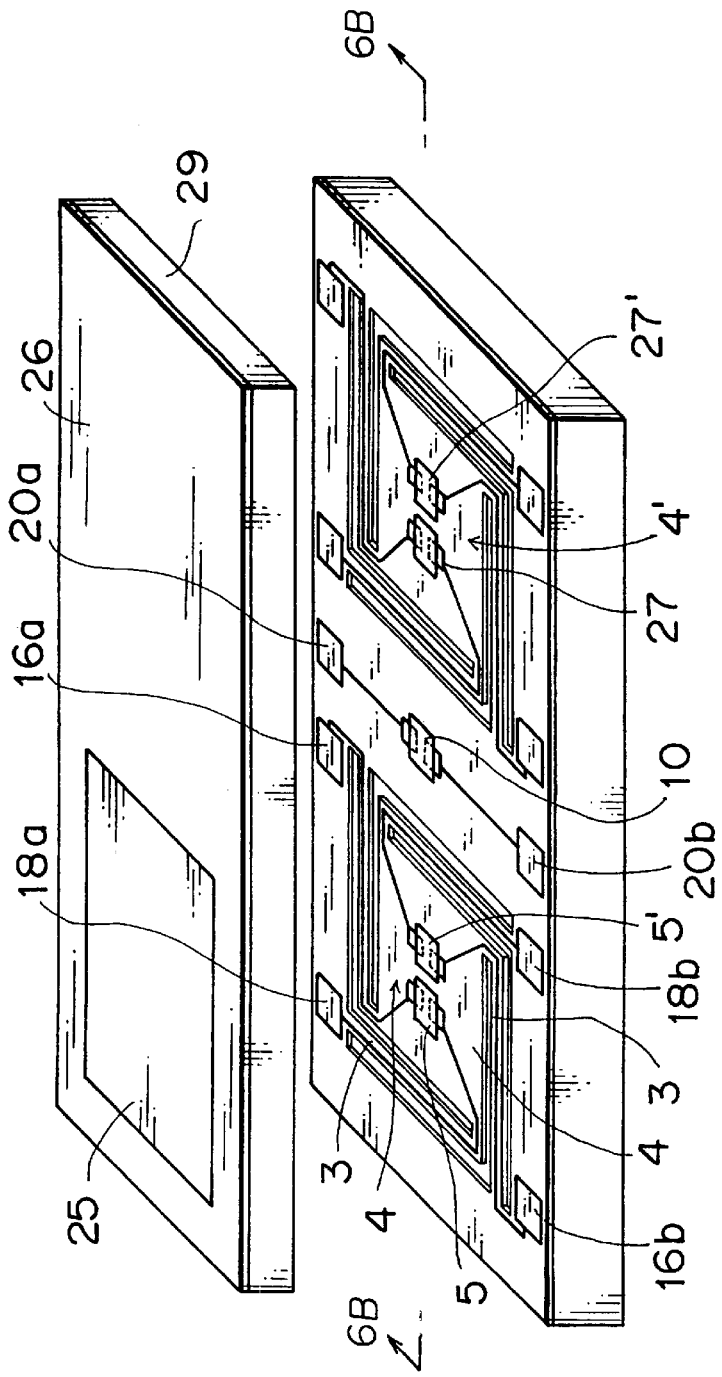
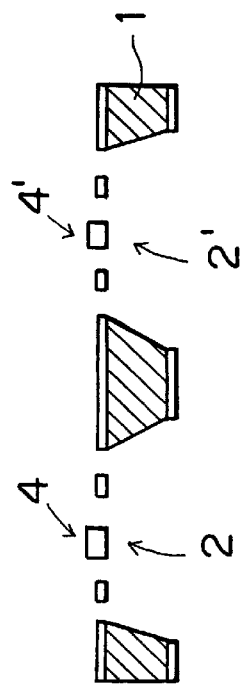
FIG. 6A
FIG. 6B

F I G. 1 3 A
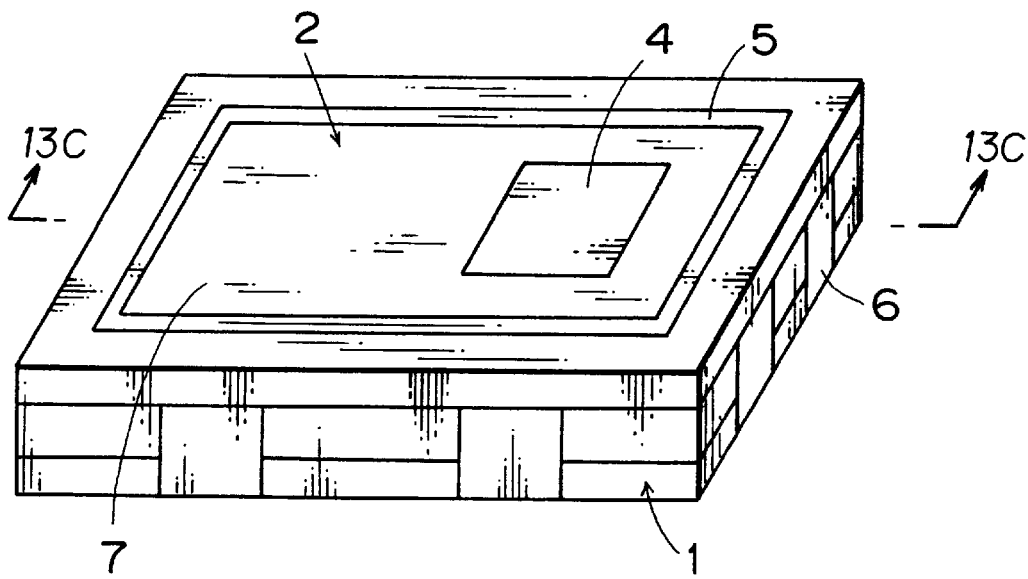
F I G. 1 3 B
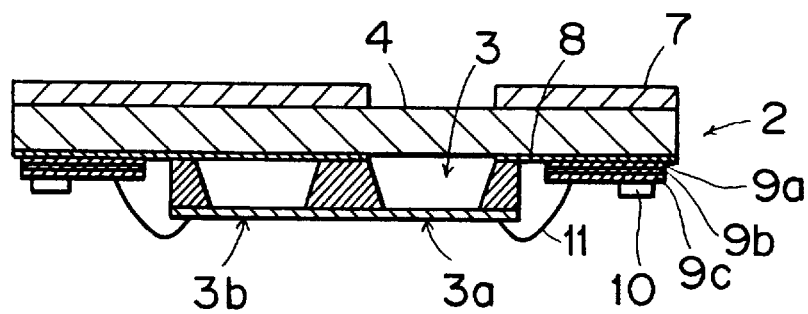
F I G. 1 3 C
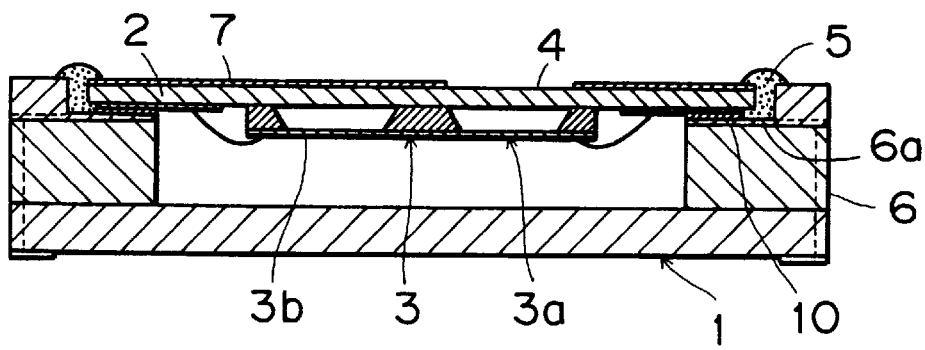

INFRARED SENSOR AND INFRARED DETECTOR

FIELD OF THE INVENTION

The present invention relates to an infrared sensor and an infrared detector for detecting temperature without contact to measure the temperature, and more particularly to an infrared sensor with high detection sensitivity whereby the infrared radiation receiving portion has both a micro air bridge structure and a temperature compensation function and an infrared detector employing the infrared sensor.

DESCRIPTION OF THE RELATED ART

A thermal type infrared detector is known as a conventional infrared detector that detects a surface temperature of an object without contact. The thermal type infrared detector is a sensor that measures the surface temperature of a high-temperature object or moving object without contact. In the thermal type infrared detector, a temperature of a thermistor at an infrared radiation detecting portion rises by the impingement of infrared radiation energy radiated from a detecting object such as from an object at high-temperature or a moving object, and a change of electrical resistance due to the temperature rise of the thermistor is gauged as a temperature change, whereby the surface temperature of a detecting object can be measured.

Generally, the infrared radiation detecting portion employs a thin film, which consists of a thermistor material or metallic resistance material whose resistance value varies with temperature, or a thin film consisting of a thermocouple. Since the quantity of infrared radiations radiated from a detecting body is generally very small, the thermal sensitive portion of the sensor for receiving infrared radiations is required to have a small heat capacity and a high infrared absorption characteristic, and also requires high precision device fabrication techniques from the view point of production. For this reason, infrared sensors are generally formed by application of a fine processing technique for semiconductors.

The infrared sensors, formed by application of a fine processing technique for semiconductors, are disclosed for example in Japanese Patent Publication No. HEI 7-65937 and Japanese Patent application Laid-Open No. HEI 3-136379. These infrared sensors are of the sensors having a micro air bridge structure. That is, the infrared radiation detecting portion is provided on top of an insulating film formed on the substrate. Then, the back side of the substrate is etched, or a sacrifice layer for bridge formation is formed and the substrate is etched selectively. Finally, with the remaining peripheral substrate, the insulating film having the infrared radiation detecting portion formed thereon is supported.

The infrared sensor with such a structure can make thermal resistance between the infrared radiation detecting portion and the substrate greater, so the heat capacity of the infrared sensor can be made very small. For this reason, the response speed of temperature detection is quick, and furthermore, an infrared detector with high sensitivity can be realized.

In another infrared sensor disclosed in Japanese Patent Application Laid Open No. HEI 6-160174, the temperature rise of the thermal sensitive portion is enhanced by optimizing the configuration of the bridge portion of the infrared sensor. Furthermore, the infrared sensor is designed so that the energy of incident infrared radiations is not dissipated, in order to obtain high sensitivity. The infrared sensor is constituted by an infrared radiation receiving portion (which is circular or square in shape), four beam portions which support the infrared radiation receiving portion, and a substrate which supports these beam portions. With this structure, the thermal resistance of the beam portion is increased, and the thermal energy of the infrared radiation passes through the beam portion and is not easily dissipated to the substrate side. Consequently, the thermal conversion efficiency of the incident infrared radiation in the infrared radiation receiving portion is enhanced and an infrared detector with even higher sensitivity is obtainable.

Furthermore, an infrared detector, previously proposed by the present applicant, is disclosed in Japanese Patent Application Laid Open No. HEI 2-201229. This infrared detector employs a thermistor material in order to make an infrared sensor with high sensitivity. More specifically, four thermistors are formed into a Wheatstone bridge circuit, as shown in FIG. 9A, and thermistors T2 and T3 on the opposite sides of the bridge circuit receive infrared radiations. If the temperatures of the thermistors T2 and T3 rise by incidence of infrared radiations, the resistance values will be changed by R. If the voltage fluctuation due to the change in the resistance values is taken to be $\Delta V$, the terminal voltage Va on the point "a" of the bridge circuit will become $V1+\Delta V$, because if the temperatures of the thermistors rise, the resistance values become smaller and the opposite thermistors have the same characteristic. Likewise, the terminal voltage Vb on the point "b" of the bridge circuit becomes $V2-\Delta V$. The output voltage V of the bridge circuit is expressed as follows:

$$V=Va-Vb=V1+\Delta V-(V2-\Delta V)=2\Delta V \tag{1}$$

where V1 and V2 are equal.

That is, as shown in Eq. (1), it is found that the output of the bridge circuit becomes double and therefore the infrared detector has been further improved as compared with a conventional infrared detector.

The infrared detector, disclosed in Japanese Patent Application Laid Open No. HEI 6-160174, has either a bridge structure where the infrared radiation receiving portion 32 is supported by beam portions 31 extending from the four corners of a cavity 30 formed in a substrate or a structure where the infrared radiation receiving portion 32 of the infrared radiation detecting portion is supported by beam portions 31 extending from the four edges of the cavity 30, as shown in FIGS. 12A through 12C. For this reason, if the area of the infrared radiation receiving portion is assumed to be constant, a structure where the length of the beam portion 31 becomes longest is the structure where the infrared radiation receiving portion 32 is supported by the four corners of the cavity 30. This structure contributes to an enhancement in the sensor sensitivity, because the structure can minimize the dissipation of the heat from the infrared radiation receiving portion 32 and therefore the temperature of the infrared radiation receiving portion can be raised rapidly.

An infrared sensor chip 23 whose infrared radiation detecting portion has a micro air bridge structure, as shown in a sectional view of FIG. 23, is usually sealed in a container such as a TO-5 type package formed a window. The infrared sensor chip 23 is mounted on a base (stem) 20 and sealed with a cap 21 having a silicon window 22. In the infrared sensor chip 23, a thermistor 25 is formed in approximately the center portion of the micro air bridge structure. Bonding pads (electrodes) are formed on the peripheral edges of the infrared sensor chip 23 and are connected to lead terminals 20a provided on the stem 20 with bonding wires 27. If infrared radiations are incident on this infrared sensor, then they will be incident on the infrared radiation receiving portion. Next, the infrared radiation receiving portion is heated and infrared radiation output voltage is generated by the thermoelectric effect performed by the thermistor film.

However, in the representative infrared detector disclosed in Japanese Patent Application Laid Open No. HEI 6-160174, in order to further improve sensor sensitivity, there is the need to enlarge the area of the infrared radiation receiving portion on which infrared radiations are incident. However, if the area of the infrared radiation receiving portion is enlarged, the length of the beam portion will have to be shortened relatively. Consequently, the thermal resistance of the beam portion connecting (or bridging) the infrared radiation receiving portion and the substrate together becomes smaller and the thermal dissipation of the infrared radiation receiving portion becomes larger, so there arises the disadvantage that sensor sensitivity is reduced.

Also, in order to solve the aforementioned problems, if the width of the beam portion is narrowed to increase the thermal resistance, there will arise the disadvantage that during a sensor device fabrication process or in an actual operating state, the mechanical strength of the beam portion will become weak and therefore breakage or damage will easily occur.

Furthermore, in the case of the infrared detector constituted by four thermistors disclosed in the aforementioned Patent Application Laid Open No. HEI 2-201229, the thermistors T2 and T3 of the infrared radiation receiving portion of FIG. 9A are formed separately, and consequently, a slight difference of configuration due to a patterning error in the fabrication process appears as a difference of heat capacity. Moreover, it is difficult for the thermistors T2 and T3 to reach the same temperature due to a slight fluctuation in the incidence of an infrared radiation which results from the fact that the thermistors T2 and T3 are formed away from each other. Consequently, the bridge circuit constituted by these thermistors has the disadvantage that the output voltage is offset, does not always become double, and becomes a voltage less than that.

Moreover, in the aforementioned infrared sensor of FIG. 23, the cap 21 and the silicon window 22 are heated by infrared radiations and the heat generated there is transferred gradually to the infrared sensor chip 23. In the infrared sensor, the material of the stem 20 is metal and the thermal conductivity is relatively high. Also, the lead terminals 20a and the stem 20 are insulated by glass, and in the case where there are provided a great number of electrodes, a reduction in the size of the stem 20 is difficult. An increase in the size of the stem 20 increases the thermal resistance of the stem 20 and therefore this infrared sensor has the disadvantage that a difference of temperature easily occur within the stem and causes an error of detection. In the structure of FIG. 23, the temperature of the cap and temperature of the window are raised by infrared radiations radiated from an object and therefore the temperature of the infrared sensor chip and the temperature of the window rise. For this reason, the infrared radiation receiving portion of the infrared sensor chip will detect the temperature of the cap and the temperature of the window as well. Although a thermistor film for temperature compensation is formed in the infrared sensor chip, the thermal capacity of the case including the cap is larger, and consequently, the thermal time constant is large and accurate temperature detection is impossible.

In addition, in order to enhance the sensitivity of the infrared sensor of the above type to infrared radiations, it is effective that the infrared radiation receiving portion and the package are spaced from each other, for example, by about 0.25 to 1 mm. However, since the stem 20 is formed by stamping, it is difficult to form an uneven configuration with a press. Although there is a numerically controlled cutting method and a method of opening a through hole and closing the hole with a reflecting plate, there arises the disadvantage that the cost becomes high.

Accordingly, it is the object of the present invention to provide an infrared sensor and an infrared detector which detect infrared radiations irradiated from a detected object and detect the temperature of the detected object without contact and which are capable of enhancing temperature detection sensitivity and detection precision.

SUMMARY OF THE INVENTION

To achieve the foregoing and other objects, an infrared sensor according to a first invention comprises a substrate formed with a cavity, an infrared radiation receiving portion supported in the form of a micro air bridge in the cavity by beam portions, two thermistor films for infrared radiation detection formed on the infrared radiation receiving portion, and a single thermistor film arranged on the substrate for detecting temperature of the substrate.

An infrared sensor according to a second aspect of the present invention comprises a substrate formed with a cavity, an infrared radiation receiving portion supported in the form of a micro air bridge in the cavity by beam portions, two thermistor films for infrared radiation detection formed on the infrared radiation receiving portion, and two thermistor films for temperature compensation arranged on the substrate.

An infrared sensor according to a third aspect of the present invention comprises a substrate formed with a cavity, an infrared radiation receiving portion supported in the form of a micro air bridge in the cavity by four hook-shaped beam portions extending from the substrate, and two thermistor films for infrared radiation detection formed on the infrared radiation receiving portion. The infrared sensor further comprises two thermistor films for temperature compensation arranged on the substrate and a single thermistor film arranged on the substrate for detecting temperature of the substrate.

An infrared sensor according to a fourth aspect of the present invention comprises a substrate formed with a first cavity and a second cavity, a first infrared radiation receiving portion supported in the form of a micro air bridge in the first cavity by a first set of four hook-shaped beam portions extending from the substrate, and a second infrared radiation receiving portion supported in the form of a micro air bridge in the second first cavity by a second set of four hook-shaped beam portions extending from the substrate. The infrared sensor further comprises two thermistor films formed on the first infrared radiation receiving portion, two thermistor films formed on the second infrared radiation receiving portion, and a thermistor film arranged on the substrate for detecting temperature of the substrate. The infrared sensor further comprises an infrared radiation transparent filter arranged above the substrate, an infrared radiation antireflection film provided on the infrared radiation transparent filter at the side of the first infrared radiation receiving portion, and an infrared radiation reflection film provided on the infrared radiation transparent filter at the side of the second infrared radiation receiving portion for shielding the second infrared radiation receiving portion from infrared radiations. The first infrared radiation receiving portion is used for detecting infrared radiations, and the second infrared radiation receiving portion is used for compensating temperature.

In the infrared sensor according to any one of the first through the fourth aspect of the present inventions, a fifth aspect of the present invention is characterized in that the beam portions are made thinner in film thickness than the infrared radiation receiving portion.

In the infrared sensor according to the fourth aspect of the present invention, a sixth aspect of the present invention is characterized in that the infrared radiation transparent filter is formed from silicon.

In the infrared sensor according to any one of the first through the sixth aspect of the present inventions, a seventh aspect of the present invention is characterized in that the thermistor is formed from an oxide of a Mn—Ni—Co system.

In the infrared sensor according to the fourth through the seventh aspect of the present inventions, an eighth aspect of the present invention is characterized in that the infrared radiation antireflection film comprises ZnS or $SiO_2$ and that the infrared radiation reflection film comprises a film of metal such as Au and Al.

In the infrared sensor according to any one of the first through the eighth aspect of the present inventions, a ninth aspect of the present invention is characterized in that the thermistor films are disposed four in number to constitute a bridge circuit. Also, two of the four thermistor films are disposed on the opposite sides of the bridge circuit to constitute a thermal sensitive portion for infrared radiation detection. The other two thermistor films are disposed on the remaining opposite sides of the bridge circuit to constitute a thermal sensitive portion for temperature compensation. A correction of temperature is made with respect to an output of an infrared detector by detecting a change in an output voltage of the bridge circuit caused by infrared radiations incident on the four thermistor films forming the bridge circuit and also by providing a thermistor film for detecting temperature of the substrate.

In the infrared sensor according to any one of the first through the ninth aspect of the present inventions, a tenth aspect of the present invention is characterized in that a package in which the infrared sensor is mounted is sealed with negative pressure and/or low thermal conduction gas.

An infrared detector according to an eleventh aspect of the present invention comprises an infrared sensor constituted by a sensor chip having four thermistor films mounted thereon, means for amplifying a differential output voltage signal of a bridge circuit constituted by the four thermistor films, and means for detecting temperature of a substrate by a thermistor film provided near the four thermistor films. The infrared detector further comprises means for converting the amplified differential output voltage signal to a digital signal, means for converting a voltage signal corresponding to the temperature of the substrate to a digital signal, and means for storing an approximate expression which is for computing temperature of an object. The infrared detector further comprises means for computing the temperature of the substrate from the output voltage signal of the bridge circuit and the voltage signal of the temperature of the substrate by the approximate expression, and means for displaying a result of the computation.

An infrared sensor according to a twelfth aspect of the present invention comprises an infrared sensor chip, and a ceramic package and a cap for sealing the infrared sensor chip. The infrared sensor chip is provided with a silicon substrate and an infrared radiation receiving portion which is supported in the form of a micro air bridge in a cavity provided in the silicon substrate by beam portions. Two thermistor films for detecting infrared radiations are formed on the infrared radiation receiving portion. A thermistor film for detecting temperature of the substrate is formed on the silicon substrate. The infrared sensor chip and electrode layers are formed on a rear surface of the cap and connected electrically with each other. The opening of the ceramic package is covered with the cap so that the electrode layers are connected electrically through bump electrodes to terminal electrodes formed on the ceramic package.

In this invention, the infrared sensor chip is bonded to the rear surface of the cap which seals the ceramic package. Therefore, if infrared radiations are incident on the infrared radiation receiving portion and temperature is detected, the temperature of the temperature compensating portion will rise nearly simultaneously. As a consequence, a similar temperature rise waveform is obtained and detection sensitivity is very high.

An infrared sensor according to a thirteenth aspect of the present invention comprises an infrared sensor chip, and a ceramic package and a cap for sealing the infrared sensor chip. The infrared sensor chip is provided with a silicon substrate and a light receiving portion which is supported in the form of a micro air bridge in a cavity provided in the silicon substrate by beam portions. Two thermistor films for detecting infrared radiations are formed on the infrared radiation receiving portion. A thermistor film for detecting temperature of the substrate is formed on the silicon substrate. The ceramic package is formed with terminal electrodes. The cap is formed with openings and also is formed with electrode layers on its rear side. The infrared sensor chip is provided on the rear side of the cap so as to cover the openings formed in the cap. The silicon substrate is provided on the front side of the cap and formed with an infrared radiation transmitting region and an infrared radiation shielding region so that the regions cover the openings formed in the cap. The opening of the ceramic package is covered with the cap so that the electrode layers are connected electrically through bump electrodes to conductive layers connected to the terminal electrodes formed on the ceramic package.

In this invention, openings are formed in the cap, and the infrared sensor chip and the silicon substrate (which is a filter for infrared radiations) are mounted so as to cover the openings. Consequently, positioning can be reliably made.

An infrared sensor according to a fourteenth aspect of the present invention comprises an infrared sensor chip, and a ceramic package and a cap for housing the infrared sensor chip. The infrared sensor chip is provided with a silicon substrate, a cavity provided in the silicon substrate, and a light receiving portion supported in the form of a micro air bridge by beam portions in the cavity. Two thermistor films for detecting infrared radiations are formed on the infrared radiation receiving portion. A thermistor film for detecting temperature of the substrate is formed on the silicon substrate. Bump electrodes on the infrared sensor chip are connected electrically to conductive layers formed in the ceramic package and then the cap is provided in the ceramic package.

In this invention, the infrared sensor chip is housed within the ceramic package. At this time, bump electrodes and terminal electrodes are connected electrically, and the upper surface of the infrared sensor chip is disposed at position near the rear surface of the cap. Therefore, this arrangement is substantially the same as a structure where the sensor chip is formed near the cap.

An infrared sensor according to a fifteenth aspect of the present invention comprises an infrared sensor chip, a ceramic package, and a cap formed with a cavity in its rear surface. With a surface of the infrared sensor chip down, the infrared sensor chip is bonded to conductive layers formed on the rear surface of the cap so that the cavity is aligned with thermal sensitive portions of the infrared sensor chip. The infrared sensor chip is provided with a silicon substrate, a cavity provided in the silicon substrate, and an infrared radiation receiving portion supported in the form of a micro air bridge in the cavity by beam portions. Two thermistor films for detecting infrared radiations are formed on the infrared radiation receiving portion. The conductive layers, connected electrically to the infrared sensor chip, are connected electrically to terminal electrode formed on the ceramic package through bump electrodes.

In the infrared sensor of this invention, a cavity is formed in a cap which doubles as an infrared radiation filter, and electrodes on the infrared sensor chip are connected electricap to the conductive layers of the cap by face-down bonding. Furthermore, the cap is connected electrically to the terminal electrodes of the ceramic package.

An infrared sensor according to a sixteenth aspect of the present invention comprises an infrared radiation sensor chip, a ceramic package, and a cap provided with an opening. With a surface of the infrared sensor chip down, the infrared sensor chip is bonded to a rear surface of the cap so that the opening is covered. A filter plate is provided so that a surface of the filter plate covers the opening. The infrared sensor chip is provided with a silicon substrate, a cavity provided in the silicon substrate, and an infrared radiation receiving portion supported in the form of a micro air bridge in the cavity by beam portions. Two thermistor films for detecting infrared radiations are formed on the infrared radiation receiving portion. Conductive layers, connected electrically to the infrared sensor chip, are connected electrically to terminal electrode formed on the ceramic package through bump electrodes.

In this invention, the infrared sensor chip is connected to the cap by face-down bonding. By sealing the opening of the ceramic package with the cap, wiring is performed and an infrared sensor is formed.

In an infrared sensor according to a seventeenth aspect of the present invention, a gap is formed between the ceramic package and the cap and is filled with a filler.

In this invention, by providing a gap between the ceramic package and the cap, heat transfer can be facilitated between the ceramic package and the cap (infrared sensor chip), and temperature can be made uniform.

The infrared sensor chip is provided with an infrared radiation receiving portion formed with two thermistors. The infrared radiation receiving portion is supported in the form of a micro air bridge in a cavity formed in a substrate by four beam portions. The infrared radiation receiving portion may be supported by four hook-shaped beam portions provided in the openings between the cavity and the infrared radiation receiving portion. Furthermore, two thermistor films for temperature compensation and a single thermistor film for measuring the temperature of the substrate are formed on the substrate formed with the cavity.

The infrared sensor chip may comprise two infrared radiation receiving portions supported by four hook-shaped beam portions extending from a substrate, two thermistor films formed on each of the two infrared radiation receiving portions, and a single thermistor film formed on the substrate for measuring the temperature of the substrate. An infrared radiation transparent filter is disposed on top of the substrate so that one of the two infrared radiation receiving portion is used for infrared radiation detection and the other is used for temperature compensation. An infrared radiation antireflection film is provided on the filter on the side of the infrared radiation receiving portion for infrared radiation detection, and an infrared radiation reflection film is provided on the filter on the side of the other infrared radiation receiving portion for shielding the other infrared radiation receiving portion from infrared radiations.

In the infrared sensor chip, since the beam portion supporting the infrared radiation receiving portion is formed into a hook shape along the cavity of the substrate and an L-shaped opening in the infrared radiation receiving portion, the area of the infrared radiation receiving portion can be formed so as to be large and therefore the heat quantity of the received infrared radiation is increased. In addition, since the effective length of the beam portion can be lengthened, the thermal resistance of the beam portion is increased and therefore the heat conduction from the infrared radiation receiving portion to the substrate can be suppressed.

For the aforementioned reasons, the temperature distribution of the infrared radiation receiving portion becomes even and the respective temperatures of two thermistor films, formed on the infrared radiation receiving portion, reach the same temperature. Therefore, when the bridge circuit of the infrared detector is constituted by both two thermistor films for infrared radiation detection and two thermistor films for temperature compensation, the output of the detector due to the temperature rise of the infrared radiation detecting thermistor films can be effectively raised by incidence of infrared radiations.

BRIEF DESCRIPTION OF THE DRAWINGS

The present invention will be described in further detail with reference to the accompanying drawings, in which:

FIGS. 2A and 2B are sectional views of a sensor chip showing the embodiment of the infrared sensor of the present invention;

FIGS. 3A and 3B are sectional views of a sensor chip showing a second embodiment of the infrared sensor of the present invention;

FIG. 6A is a perspective view showing a third embodiment of the infrared sensor of the present invention;

FIG. 6B is a sectional view taken substantially along line X—X' of FIG. 6A;

FIG. 13A is a perspective view showing a fourth embodiment of the infrared sensor of the present invention;

FIG. 13B is a sectional view of the cap having the infrared sensor chip mounted thereon;

FIG. 13C is a sectional view taken substantially along line X—X' of FIG. 13A;

DETAILED DESCRIPTION OF THE PREFERRED EMBODIMENTS

Figure 1:
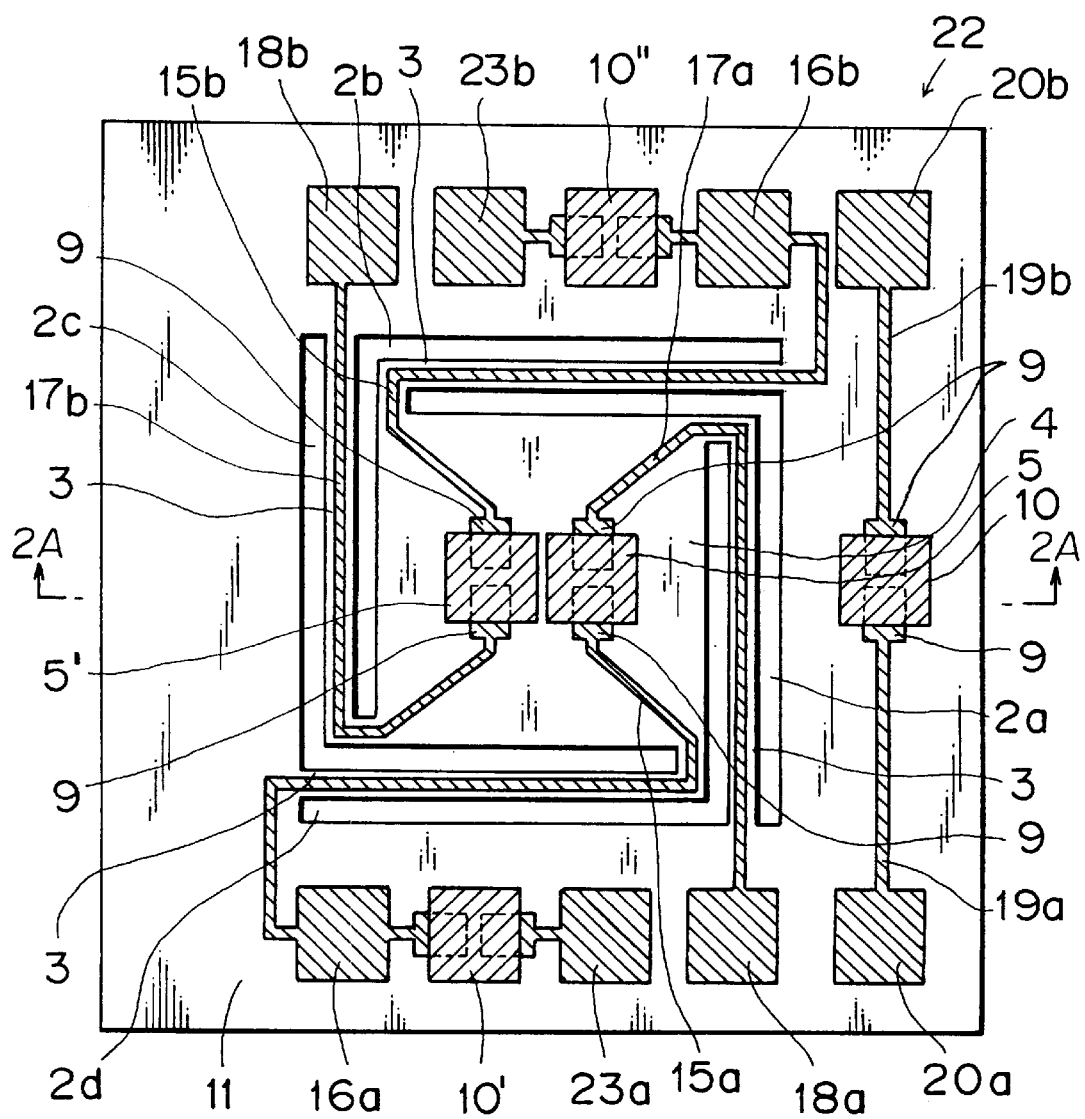
FIG. 1 is a plan view showing a first embodiment of an infrared sensor of the present invention.

Preferred embodiments of an infrared sensor and an infrared detector according to the present invention will hereinafter be described in detail in reference to the drawings.

The infrared sensor of this embodiment is constituted by a sensor chip formed from a silicon substrate. Describing in reference to FIGS. 1 and 2A, a substrate 1 is a single-crystal silicon substrate and is formed with a cavity 2. The cavity 2 is formed by selectively etching part of the substrate 1 by application of a fine processing technique for semiconductors. Four hook-shaped beam portions 3 extend from the four corners of the cavity 2 along the edges of the cavity 2 and support an infrared radiation receiving portion 4 in the form of a micro air bridge. Just under the infrared radiation receiving portion 4 is the cavity 2, and four L-shaped openings 2a through 2d are formed around the four beam portions 3. Just under the L-shaped openings 2a through 2d is the cavity 2.

The central portion of the infrared radiation receiving portion 4 is formed with two thermistor films 5 and 5'. The thermistor films 5 and 5' of the infrared radiation receiving portion 4 are formed on electrode films 9 formed in opposition to each other on insulating films 7 and 8. The insulating film 7 and 8 are formed on an insulating film 6a by sputter deposition or chemical vapor deposition (CVD). The insulating film 6a is formed on the substrate 1 by thermal oxidation. Furthermore, at the same time with the thermistor films 5 and 5', thermistor films 10, 10', and 10" are formed in the same fabrication process. On the thermistor films 5, 5', 10, 10', and 10" a protective insulating film 11 is formed, and on the protective insulating film 11, a buffer film 12, a glass layer 13, and an insulating film 14 are formed in sequence by CVD.

FIG. 2B shows a sectional view of the case where the entire film thickness of the infrared sensor chip of FIG. 2A is made thinner to reduce the heat capacity by omitting the buffer film 12, the glass layer 13, and the insulating film 14, formed on the thermistor films 5, 5', 10, 10', and 10" of FIG. 2A, and also omitting the insulating films 7 and 8 formed on the substrate 1.

The fabrication method of the infrared sensor chip which is used in the infrared detector of the present invention will next be described in detail in reference to FIG. 2A.

The substrate 1 is a (110) or (100) oriented silicon substrate with a thickness of about 250 μm. This silicon substrate 1 is processed by thermal oxidation at a temperature of 900 to 1000° C. to form the insulating films 6a and 6b of silicon dioxide ($SiO_2$) of about 0.1 to 1 μm thick on both surfaces of the substrate 1. In the final process, the insulating film 6b is used as an etching mask when part of the substrate 1 is selectively etched to form the cavity 2.

Thereafter, the insulating film 7 of aluminum oxide ($Al_2O_3$) or tantalum oxide ($Ta_2O_2$) of 0.1 to 3 μm thick is formed by sputter deposition or CVD. The insulating film 7 consisting of aluminum oxide or tantalum oxide is greater in thermal expansion coefficient than the insulating film 6b of silicon dioxide, so the insulating film 7 has a function of alleviating a thermal stress which is exerted on the substrate 1.

Furthermore, the insulating film 8 is formed subsequently on the insulating film 7. The insulating film 8 is formed from a silicon dioxide ($SiO_2$) or oxinitride silicon (SiNO) material of 0.1 to 1 μm thick by sputter deposition or CVD. The insulating film 8, when a thermistor material consisting of a metal oxide is used as the thermistor films 5, 5', 10, 10', and 10", functions as an antidiffusion film, which prevents the component constituting the insulating film 7 from diffusing into the aforementioned thermistor film by a thermal process. The insulating film 8 also has a role of preventing a change in an electric resistance due to the reaction between the insulating film 7 and the thermistor film and thereby maintaining the stability of the electric performance of the thermistor film.

The electrode film 9 is formed so as to have a film thickness of 0.1 to 0.5 μm in opposition to the surface of the insulating film 8. As the material of the electrode film 9, platinum (Pt) is best, but nickel (Ni) or chrome (Cr) may be employed.

Next, the thermistor films 5, 5', 10, 10', and 10" of about 0.1 to 0.5 μm thick are formed on the electrode film 9 by a sputtering method. These thermistor films are formed by a sputtering method with a thermistor sintered body as a "target" or cathode, and the thermistor sintered body consists of a transition metal oxide of a Mn—Ni—Co system. As an example of the sputtering conditions, the sputter pressure is about 0.2 to 0.7 Pa, the temperature at which substrate 1 is heated is about 200 to 500° C., and sputtering is performed in an atmosphere of Ar gas. After formation of the thermistor films 5, 5, 10, 10', and 10" by patterning, a thermal process is performed in air at a temperature of about 400 to 900° C. for about 1 to 5 hours.

Note that the thermistor films are not limited to the aforementioned composition system but may be thin films consisting of other compositions which have been used as a thermistor material. It is a matter of course that the thermistor films may be silicon carbide films, or amorphous Si films formed by plasma CVD.

Also, for the aforementioned thermistor films, various electric characteristics are obtainable either by varying the composition of the target material, film thickness, or electrode configuration, or by forming a multilayer structure by varying the composition of each layer.

Subsequently, after formation of the thermistor films 5, 5', 10, 10', and 10", a passivation film for protecting the aforementioned thermistor films are formed. A protective insulating film 11, such as a silicon dioxide film, a silicon nitride film, or an oxinitride silicon film, is formed to a film thickness of about 1 to 3 μm on the thermistor films 5, 5', 10, 10', and 10". On the protective insulating film 11 a buffer film 12 consisting of a thin film of tantalum oxide ($Ta_2O_5$) or titan dioxide ($TiO_2$) is formed. The film thickness of the buffer film 12 is about 0.01 to 1 μm. The buffer film 12 can prevent thermal stress which is produced when a glass layer 13 of a borosilicate glass oxide is formed in a postprocess. In a thermal process, the buffer film 12 can also prevent part of the composition constituting the aforementioned glass layer 13 from diffusing into the thermistor films 5, 5', 10, 10', and 10" and the electric characteristics from fluctuating.

After the buffer film 12 is formed by patterning and is thermally processed, the glass layer 13 is formed by a sputtering method. The glass layer 13 in this embodiment is formed by sputtering from a target consisting of an oxide of a lead borosilicate glass ($PbO$—$B_2O_3$—$SiO_2$) system. The glass layer 13 is heated at a temperature of about 300 to 800° C. after formation of the layer and is melted to improve the step coverage of an underlying film. At the same time, it becomes possible that the number of the pin holes of the glass layer 13 can be reduced. This film also becomes a good infrared absorbing film. The infrared absorption spectra of the $SiO_2$ film and the $PbO$—$B_2O_3$—$SiO_2$ film (glass layer), formed by sputtering, are shown in FIGS. 5A and 5B, respectively.

Figure 5A:
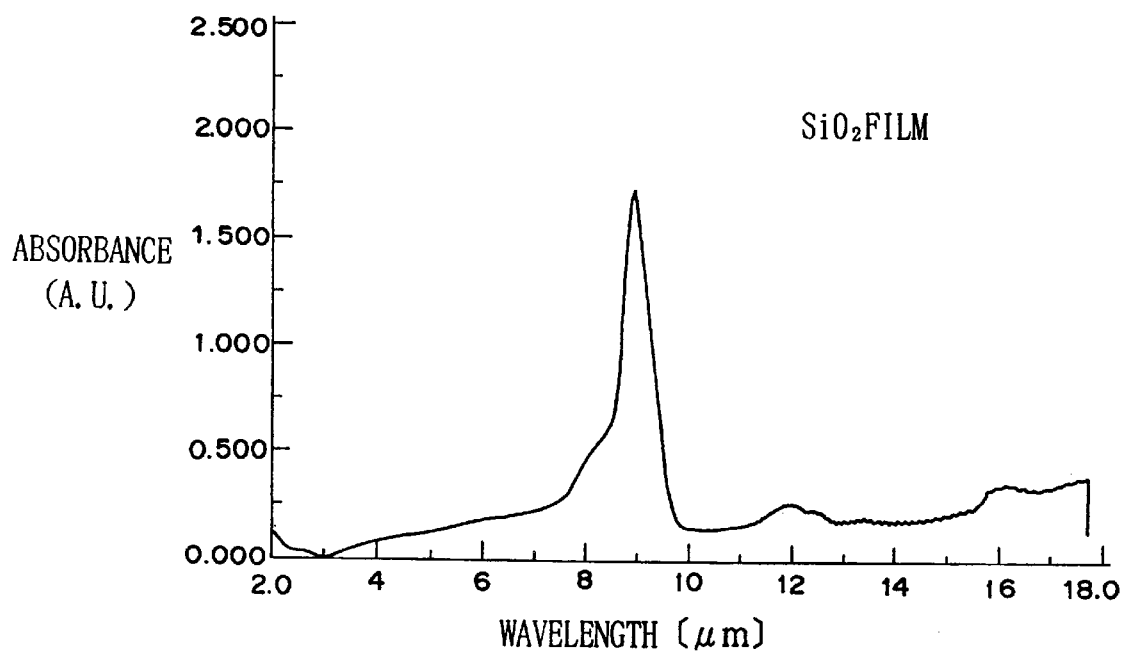
FIGS. 5A and 5B are diagrams showing an infrared absorption characteristic.
Figure 5B:
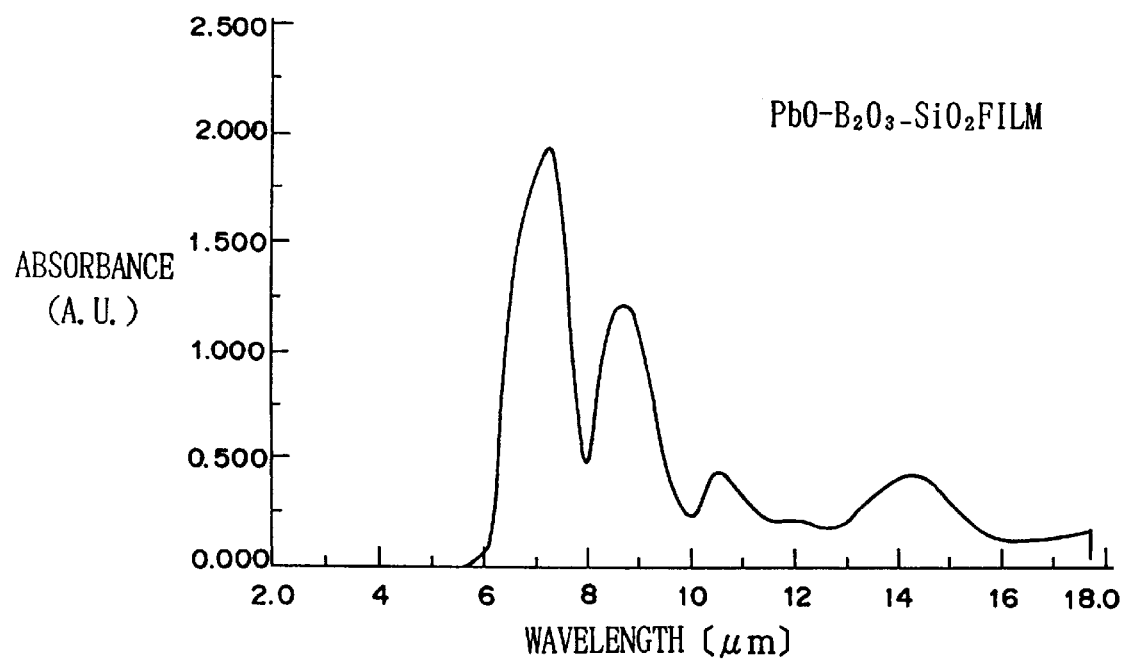

As evident in FIGS. 5A and 5B, the $PbO$—$B_2O_3$—$SiO_2$ glass layer has an absorption band at a wavelength of about 6 to 11 μm (about 110 to 210° C. in terms of temperature equivalent), while the silicon dioxide film has an absorption band at a wavelength of about 8 to 9.5 μm (about 30 to 90° C. in terms of temperature equivalent). Thus, it has been confirmed that the $PbO$—$B_2O_3$—$SiO_2$ glass layer is more effective for the detection in a wide temperature range in comparison with the conventional silicon dioxide film.

Note that the glass layer 13 is not limited to the lead borosilicate glass of the embodiment of the present invention. For example, even if other elements were added to the borosilicate glass material of this embodiment instead of lead and the borosilicate glass (including borosilicate glass having no addition) were used, the same electrical performance and mechanical performance as the lead borosilicate glass of the embodiment would be obtainable only by changing the heating temperature after film formation.

Next, an insulating film 14 of 0.05 to 2 μm in thickness consisting of either silicon dioxide, silicon nitride, or silicon oxinitride is formed on the glass layer 13. This insulating film 14 is formed for protecting the glass layer 13 when the cavity 2 is formed by an anisotropic etching process. The L-shaped openings 2a through 2d, which form both the infrared radiation receiving portion 4 and the beam portions 3 supporting the infrared radiation receiving portion 4, are patterned by etching the protective insulating film 11, the glass layer 13, and the insulating film 14 by employing buffered hydrofluoric acid (BHF).

Note that if the insulating films 11, 13, and 14, stacked on top of the beam portions 3 shown in FIG. 2A, are removed concurrently when the L-shaped openings 2a through 2d are formed by etching, the film thickness of each beam portion 3 can be made thinner than that of the infrared radiation receiving portion 4, as shown in FIG. 3A. By making the film thickness of the beam portion 3 thinner, the thermal resistance of the beam portion 3 is increased and the heat absorbed by the infrared radiation receiving portion 4 becomes difficult to dissipate, and consequently, the detection sensitivity of the infrared sensor can be enhanced. Likewise, in FIG. 2B, if the insulating film 11 is removed, the film thickness of the beam portion 3 can be made thinner. The thermal resistance of the beam portion 3 is increased and the heat absorbed by the infrared radiation receiving portion 4 becomes difficult to dissipate, so the detection sensitivity of the infrared sensor can be enhanced.

The final fabrication process of the infrared sensor chip is the process of performing anisotropic etching to form the cavity 2 in the silicon substrate 1. The insulating film 6b is patterned to form an etching mask by employing photolithography. For example, hydrazine hydrate is employed as an etchant. By selectively etching the reverse of the silicon substrate 1 at about 110° C. for about 2 hours by the etchant, the cavity 2 is formed in the silicon substrate 1. The infrared radiation receiving portion 4 is formed into a micro air bridge structure, and the infrared sensor chip is formed.

While the aforementioned embodiment has been described with regard to the structure of a single infrared sensor chip, actually a great number of infrared sensor chips having the aforementioned structure are formed on a single silicon wafer, and after formation of a cavity, individual infrared sensor chips are obtained by dicing. Also, the configuration of the electrode film is not limited to the configuration shown in the embodiment but may be a configuration like the teeth of a comb.

As shown in FIG. 1, the infrared radiation receiving portion 4, formed in the central portion of the sensor chip, is held in the form of a micro air bridge by four beam portions 3 extending from the corners of the cavity 2. Lead portions 15a and 15b extend from electrode films 9 just under two thermistor films 5 and 5' formed on the infrared radiation receiving portion 4 and are respectively connected to electrode pad portions 16a and 16b formed on the substrate 1 through the beam portions 3. The electrode pad portions 16a and 16b are connected to electrode films just under thermistor films 10' and 10", respectively. The lead portion of the other electrode film just under the thermistor film 10' is connected to an electrode pad portion 23a. Similarly, the lead portion of the other electrode film just under the thermistor film 10" is connected to an electrode pad portion 23b. Also, Lead portions 17a and 17b extend from the electrode films 9 just under the thermistor films 5 and 5' and are respectively connected to electrode pad portions 18a and 18b formed on the substrate 1 through the beam portions 3. Furthermore, on the aforementioned sensor chip there is formed an independent thermal sensitive device constituted by a thermistor film 10, lead portions 19a and 19b, and electrode pad portions 20a and 20b.

Figure 4:
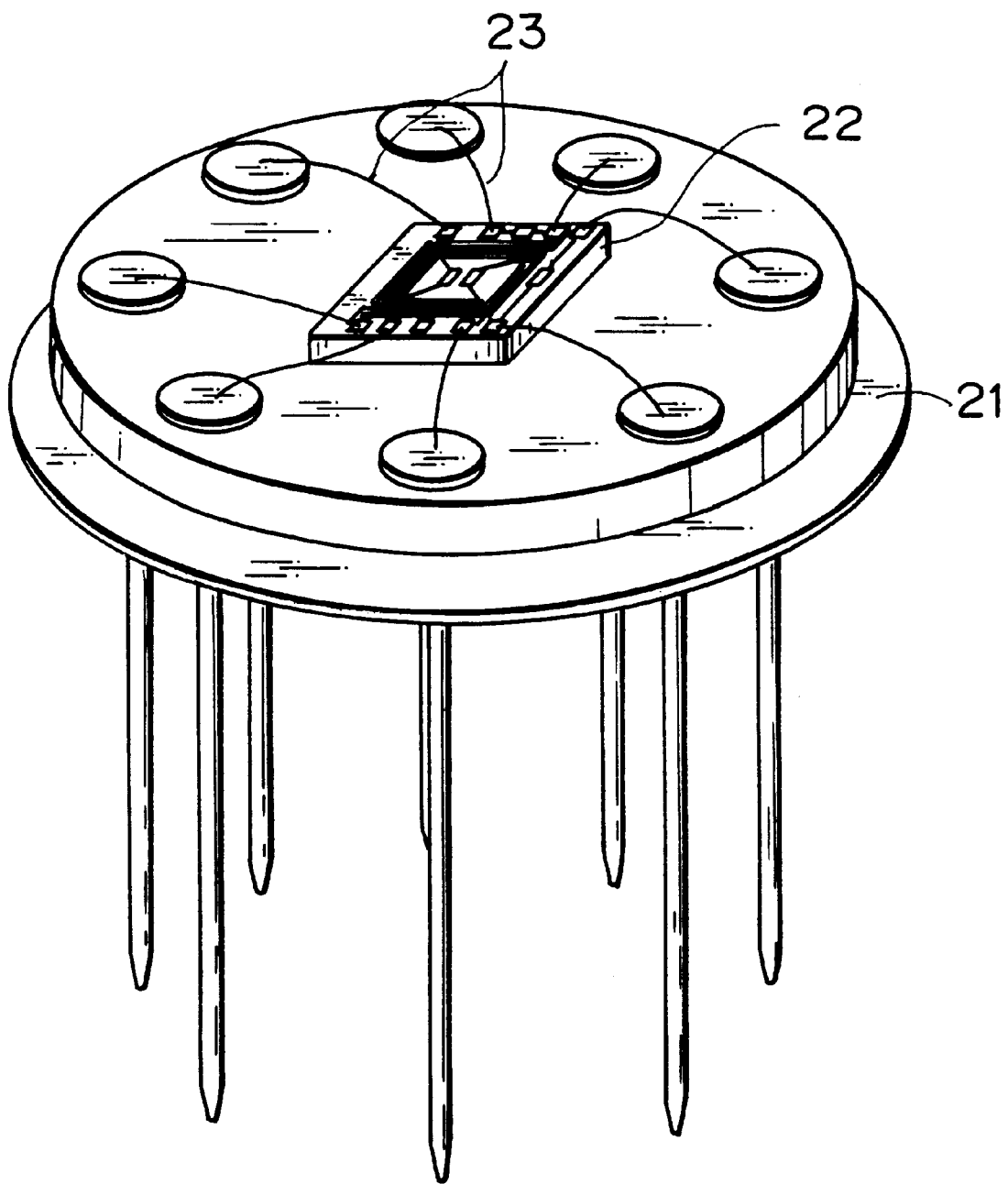
FIG. 4 is a perspective view showing the sensor chip of the infrared sensor of the present invention mounted on the stem of an IC package.

FIG. 4 shows an embodiment of the case where the infrared sensor chip of the aforementioned embodiment was mounted on the stem of an IC package. In the figure, a sensor chip 22 is mounted on a stem 21 made of an insulating body or metal. The electrode pad portions 16a, 16b, 18a, 18b, 20a, 20b, 23a and 23b (shown in FIG. 1) on the chip 22 are connected to terminals provided on the stem 21 with bonding wires 23. The stem 21 having the chip 22 mounted thereon is sealed hermetically in a manner known in the prior art with a cap provided with an infrared radiation transmittance filter consisting of glass, plastic, or single-crystal material whose infrared radiation permeability is high. When the package is sealed hermetically with the cap, air within the package is removed and in a state of negative pressure. The built-up structure of the cap with an infrared radiation transparent filter is known in the prior art and therefore the illustration is omitted.

Figure 9:
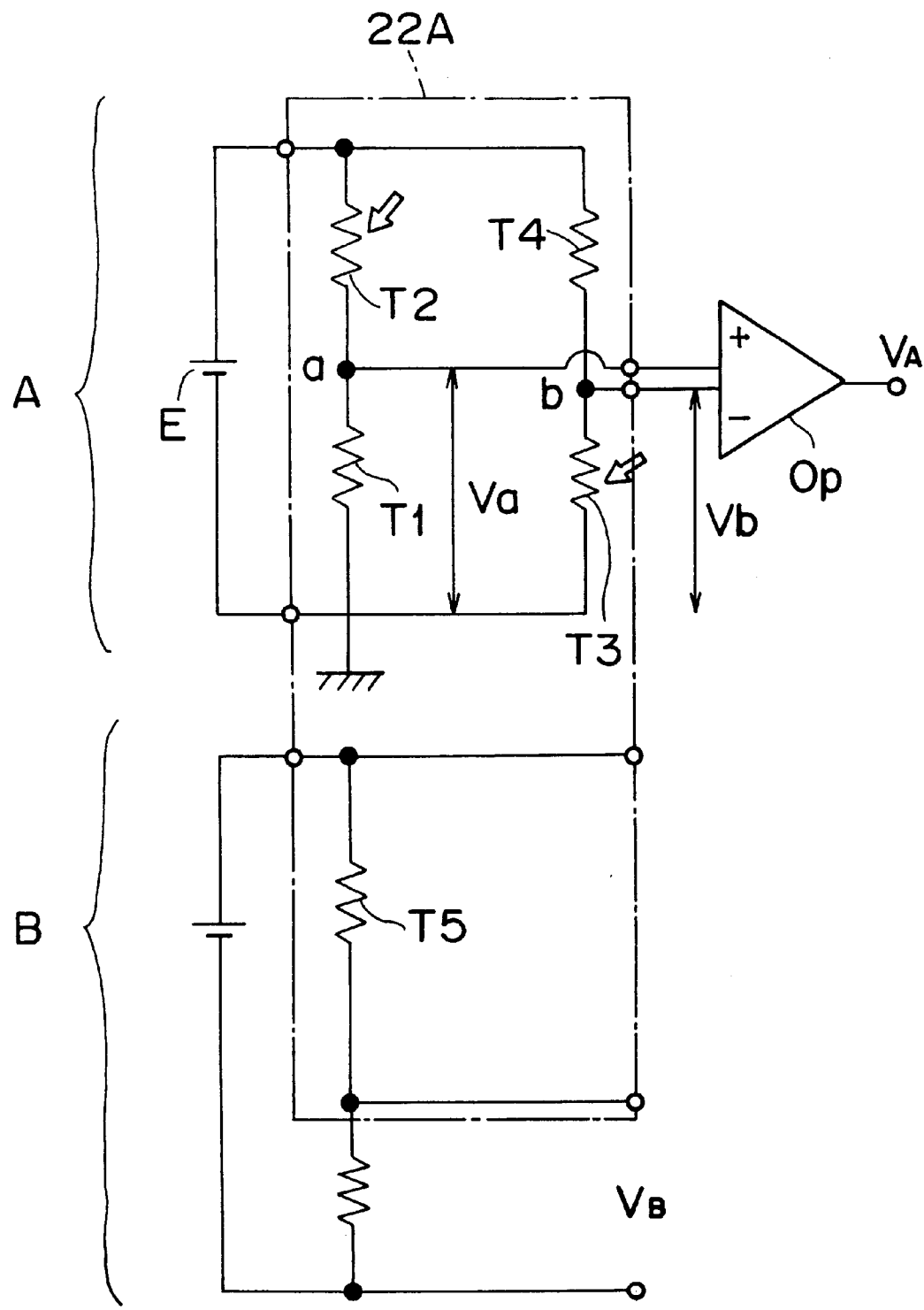
FIG. 9 is a circuit diagram showing an embodiment of a detection circuit of an infrared detector of the present invention.

The infrared detector, built up as shown in FIG. 4 and provided with an infrared radiation transparent filter, is wired so as to constitute a Wheatstone bridge circuit such as that shown in FIG. 9. In FIG. 9, resistors $T_2$ and $T_3$ correspond to the aforementioned thermistor films 5 and 5' and constitute a thermal sensitive portion for infrared radiation detection. Resistors $T_1$ and $T_4$ correspond to the aforementioned thermistor films 10' and 10" formed on the substrate 1 and function as a thermal sensitive portion for temperature compensation. The thermistor films 5 and 5' and the thermistor films 10' and 10" are constructed so as to be positioned on the opposite sides of the Wheatstone bridge circuit.

The operation of the infrared sensor of the aforementioned embodiment will next be described. An infrared radiation passes through the infrared radiation transparent filter provided on the cap sealing the stem 21. Then, the infrared radiation is absorbed by the glass layer 13 and is converted to heat. The temperatures of thermistor films 5 and 5' rise. At this time, the infrared radiation receiving portion 4 is thermally isolated from the substrate 1 by the beam portions 3 whose thermal resistance is large, and the heat absorbed by the infrared radiation receiving portion 4 is difficult to dissipate to the substrate 1. Therefore, the temperature distribution within the infrared radiation receiving portion 4 becomes even and two thermistor films 5 and 5' reach the same temperature. On the other hand, the thermistor films 10' and 10", formed on the substrate 1, have a large heat capacity compared with the infrared radiation receiving portion 4 and therefore the temperature rise due to the incident infrared radiation is slight to the extent that it is negligible. Consequently, the temperature detection of an object can be made without employing a special means of shielding. As previously described, the temperature distribution of the infrared radiation receiving portion 4 becomes even and therefore the resistors $T_2$ and $T_3$ of the bridge circuit of FIG. 9 are varied to the same resistance value by an incident infrared radiation. Consequently, the output voltage of the bridge circuit is double the case of a single thermistor film for infrared radiation detection, and higher precise temperature detection can be made compared with a conventional infrared detector.

On the other hand, in the infrared detector of such a thermistor bolometer type, if the input voltage is made large, the value of ΔV will be increased and therefore the output voltage of the bridge circuit (i.e., infrared detector) will become large. Consequently, the infrared detector will become insusceptible to the influence of noise and there is the advantage that high sensitivity temperature detection can be made.

However, in the infrared sensor of FIG. 1, if the applied voltage of the bridge circuit is made large, the thermal sensitive portion (i.e., thermistor film) will generate heat and rise in temperature, but since the thermal capacities of the infrared radiation receiving portion and the substrate 1 are different, the degree of a change in the resistance value of the infrared radiation receiving portion differs from that of the thermistor film on the substrate 1 due to the heat generated by the thermal sensitive portion. For this reason, the voltages on the connecting points a and b of the bridge circuit of FIG. 9 vary, and there is the disadvantage that even when there is no incidence of infrared radiations, the output voltage (error voltage) of the bridge circuit will arise. That is, there is the disadvantage that an offset voltage will occur and therefore the input voltage of the infrared detector cannot be made larger. In addition, in the case where the infrared detector is employed under the circumstance where the surrounding temperature fluctuates rapidly, the infrared detector has the disadvantage that an error voltage arises.

Another embodiment of the present invention will next be described in reference to FIGS. 6A and 6B. This embodiment will be described with regard to an infrared sensor chip which improves the aforementioned disadvantages and where a large output signal is obtainable.

FIG. 6A is a perspective view showing an embodiment of the infrared sensor, and FIG. 6B is a sectional view taken along line X—X' of FIG. 6A. FIGS. 6A and 6B show the structure of an infrared sensor of the case where two infrared radiation receiving portions are formed on a single chip. Two infrared radiation receiving portions 4 and 4' are supported in the form of a micro air bridge on a single substrate 1 by beam portions 3 having a similar structure as FIG. 1 and are formed in cavities 2 and 2'. The infrared radiation receiving portions 4 and 4' are formed with two thermistor films 5 and 5' and two thermistor films 27 and 27', respectively. Also, a thermistor film 10 is provided on the substrate 1 for detecting temperature of the substrate 1. In FIG. 6, the thermistor film 10 is disposed on the center of the substrate 1. Furthermore, on the substrate 1 there is provided a silicon cap 29 through which an infrared radiation is transmitted. The cap 29 has a shielding section for shielding the infrared radiation receiving portion 4', which is for temperature compensation, from infrared radiations. The silicon cap 29 functions as an infrared radiation transparent filter. Furthermore, the surface of the cap 29 over the infrared radiation receiving portion 4, which is for infrared radiation detection, is coated with an infrared radiation antireflection film 25 consisting of $ZnS$, $SiO_2$ and the like. The surface of the cap 29 over the infrared radiation receiving portion 4', which is for temperature compensation, is coated with an infrared radiation reflection film 26 consisting of aluminum (Al), gold (Au) and the like whose reflectance of the infrared radiation is high. The infrared sensor, constructed in this way, is mounted and fixed on the stem 21 consisting of an insulating body or metal, as shown in FIG. 4, and the electrode pads on the chip are connected to the terminals on the stem with bonding wires. Alternatively, the infrared sensor chip is mounted on a surface mount package.

Figure 7:
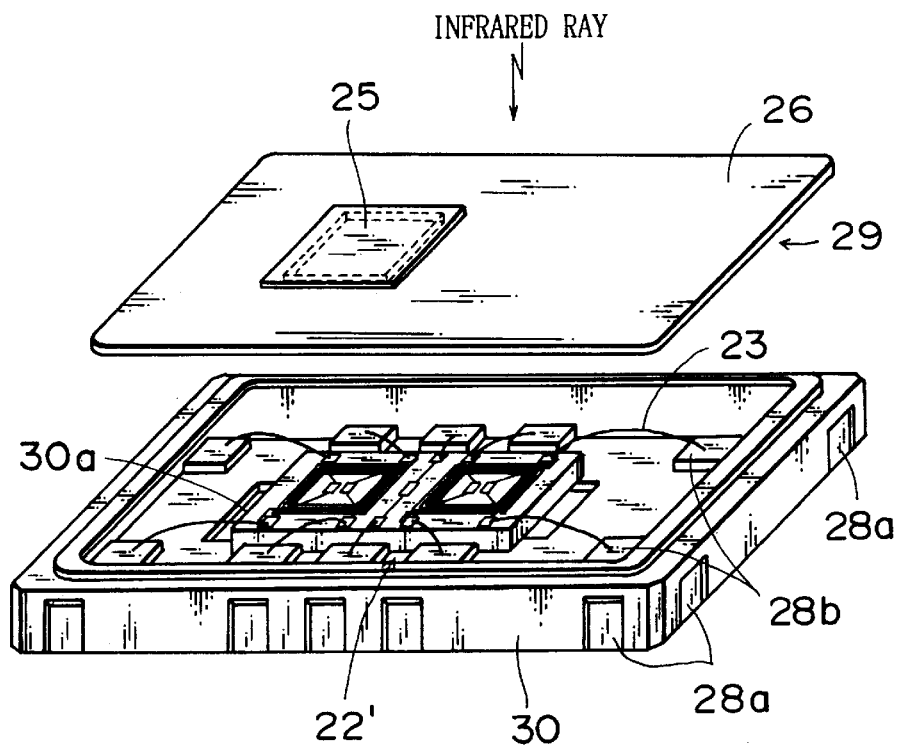
FIG. 7 is a perspective view showing an embodiment of the case where the infrared sensor of the present invention is mounted in a package.
Figure 8:
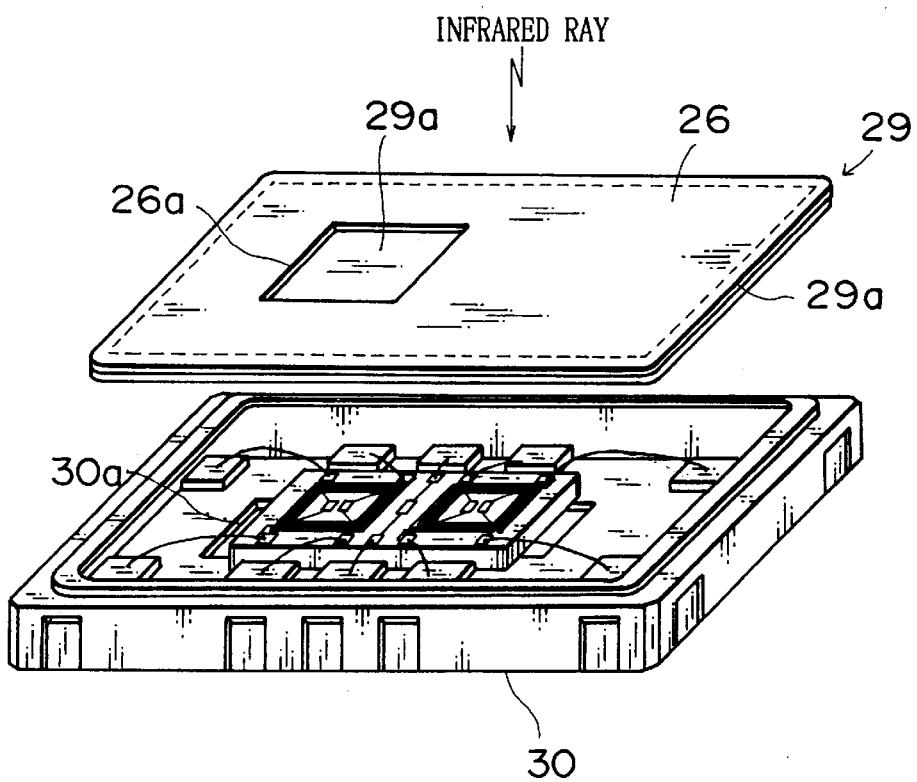
FIG. 8 is a perspective view showing another embodiment of the case where the infrared sensor of the present invention is mounted in a package.

FIGS. 7 and 8 show the embodiments where the infrared sensor chip shown in FIG. 6 is mounted in a surface mount package, and a description will be made in reference to the figures.

In FIG. 7, a sensor chip 22' is mounted and fixed inside a ceramic package 30. The terminal portions 28b of the electrodes 28a of the package 30 protrude into the package 30, and the electrode pads of the sensor chip 22' and the protruding terminal portions 28b are wired with bonding wires 23 or lead frames. An infrared radiation transparent filter is formed from a plate of metal (cap, infrared radiation reflection film) 26, such as kovar and an iron-nickel alloy. The infrared radiation transparent filter 26 is opened at the portion corresponding to the infrared radiation receiving portion for infrared radiation detection. To cover the opening, a silicon substrate (antireflection film) 25 is glued and fixed with low melting point glass, and a metal plate (cap) 29 is formed. Furthermore, the metal plate 29 and the ceramic package 30 are sealed with an adhesive agent.

FIG. 8 shows the package structure where a ceramic package 30 with a sensor chip is sealed with a cap 29. The cap 29 consists of a silicon substrate 29a and an infrared radiation reflection film 26 stacked on top of the silicon substrate 29a, and the infrared radiation reflection film 26 is provided with an opening 26a. Nickel and gold are plated as a sealing material for the cap 29, and the cap 29 is brazed or soldered with a low melting point brazing material (Au—Sn) or a soldering material (PbSn). The silicon substrate 29a consisting of an infrared radiation antireflection film is exposed to the opening 26a of the infrared radiation reflection film 26. The bottom surface of the ceramic package 30 is formed with a recess portion 30a, and the infrared radiation receiving portion 4 is formed at a position away from the bottom surface of the ceramic package 30. Therefore, the dissipation of heat from the infrared radiation receiving portion through the surrounding atmosphere can be prevented and the arrangement is effective for improving sensitivity.

The infrared sensors of FIGS. 7 and 8 have a structure where the sensor chip 22' is mounted in the ceramic package 30. Infrared rays are incident on the infrared radiation receiving portion 4 through the infrared radiation antireflection film and are converted to heat by the thermal sensitive portions (thermistor films 5 and 5'). The temperature of the infrared radiation receiving portion 4 rises. Since the infrared radiation receiving portion 4' is shielded from infrared radiations by the infrared radiation reflection film 26, the infrared radiation receiving portion 4' detects a change in the surrounding temperature. This infrared sensor is constituted by the bridge circuit of FIG. 9 and is wired so that the thermistor films 5 and 5' on the infrared radiation receiving portion 4 correspond to the resistors T2 and T3 of FIG. 9 and that the thermistor films 27 and 27' on the infrared radiation receiving portion 4' correspond to the resistors T1 and T4 of FIG. 9. With this arrangement, an infrared detector which can detect an accurate temperature without contact can be formed.

In the case where the fluctuations in the B value and resistance values of four thermistor films, formed on the sensor chip, are large or where the fluctuation in configuration of the infrared radiation receiving portions is large, a difference of heat capacity causes temperature drift or sensitivity fluctuation and appears as a fluctuation error in the bridge output voltage. In such a case, a fluctuation error in the output voltage can be made smaller by mounting a trimming thermistor or resistor in an amplifier circuit and correcting the fluctuation.

In the embodiment of the infrared sensor of the present invention shown in FIG. 6, two light receiving portions 4 and 4' of the same configuration and structure are formed on a single chip. Therefore, when the thermistor films 5, 5', 27, and 27' are formed into a bridge circuit, the thermal dissipation constants of the two infrared radiation receiving portions are the same even in the case where the surrounding temperature changes suddenly or where the applied voltage of the bridge circuit becomes large and therefore each thermistor film generates heat. Also, the two thermistor films, arranged on each infrared radiation receiving portion, reach the same temperature, for the aforementioned reasons. Hence, when there is no incidence of infrared radiations, the bridge output (corresponding to dark current) can be made zero. Therefore, the output of the infrared detector can be made larger, and consequently, the S/N ratio becomes large and an infrared detector where the temperature detection of an object can be made with a high degree of accuracy can be provided.

Describing further about the present invention, the thermistor film 10 on the sensor chip of FIG. 1 or 6 is used for measuring the substrate temperature of the sensor chip. In the case where non-contact temperature measurements are made, from Stefan-Boltzmann's law it is known that the infrared radiation energy quantity W which is incident on an infrared sensor satisfies the following equation.

$$W = \sigma(\epsilon_B T_B^4 - \epsilon_s T_s^4) \qquad (2)$$

where W is the infrared radiation energy incident on the infrared sensor, $\sigma$ is the Stefan-Boltzmann constant, $\epsilon_B$ is the radiant efficiency of an object, $\epsilon_s$ is the radiant efficiency of the infrared radiation receiving portion of the sensor, $T_B$ is the temperature of an object, and $T_S$ is the substrate temperature of the sensor chip.

Figure 10:
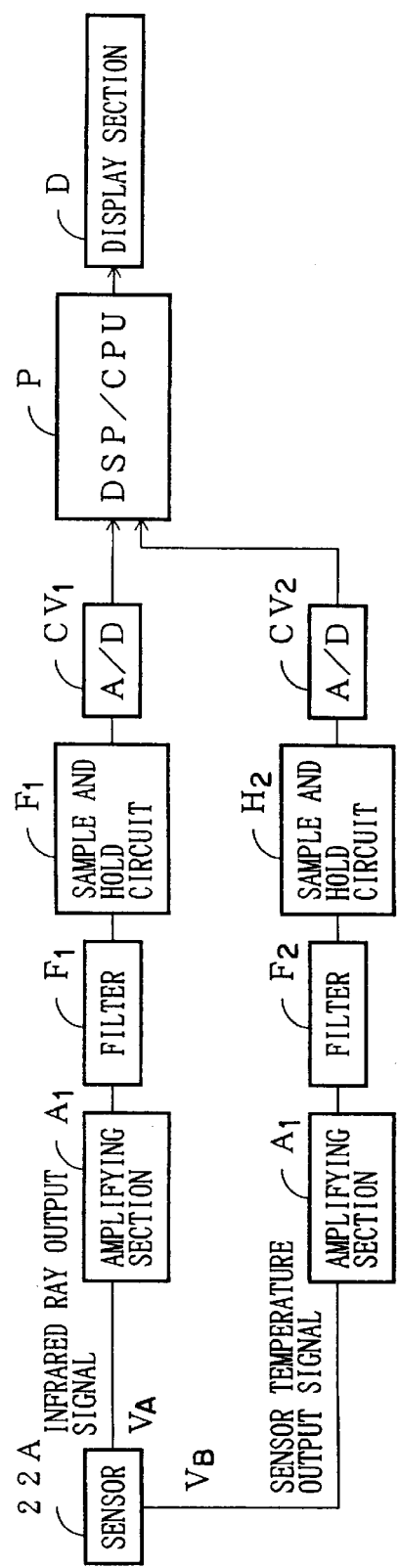
FIG. 10 is a block diagram showing an embodiment of the infrared detector of the present invention.
Figure 11:
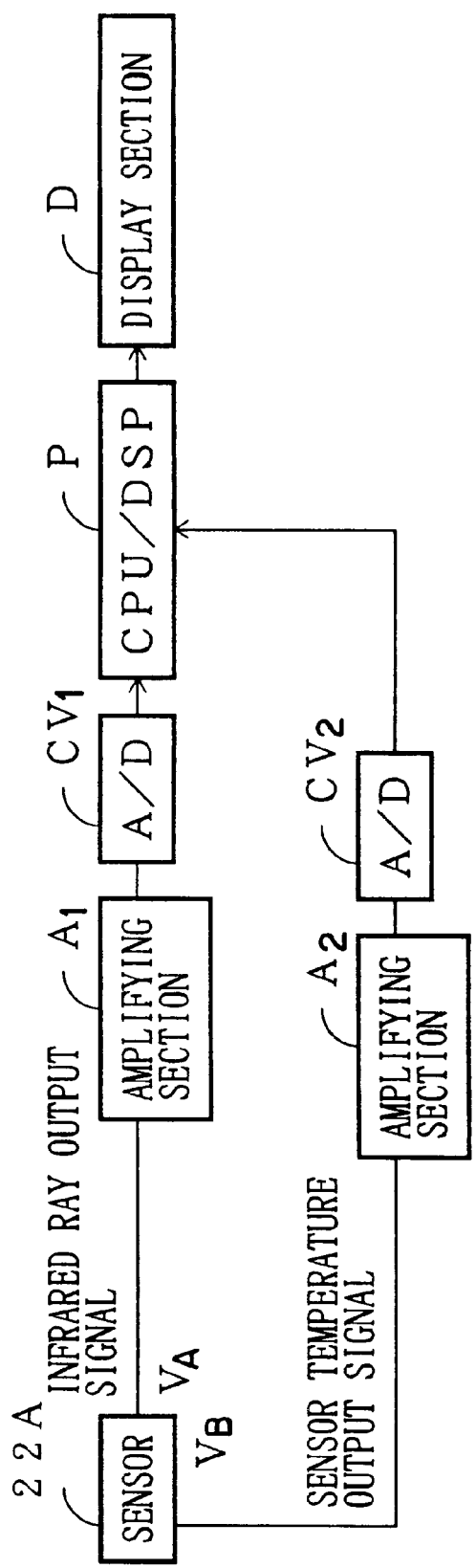
FIG. 11 is a block diagram showing another embodiment of the infrared detector of the present invention.
Figure 12A:
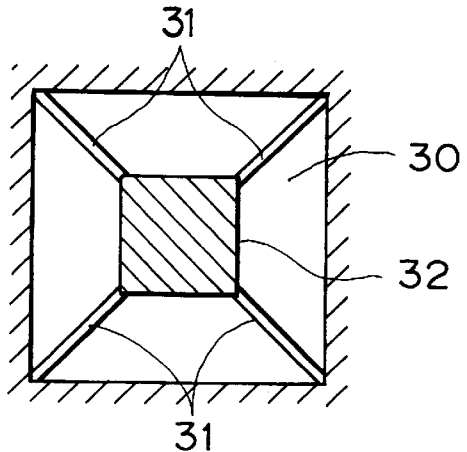
FIGS. 12A, 12B and 12C are plan views showing the essential part of a conventional infrared sensor.
Figure 12B:
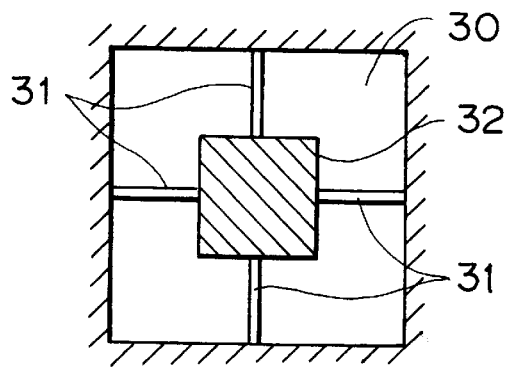
Figure 12C:
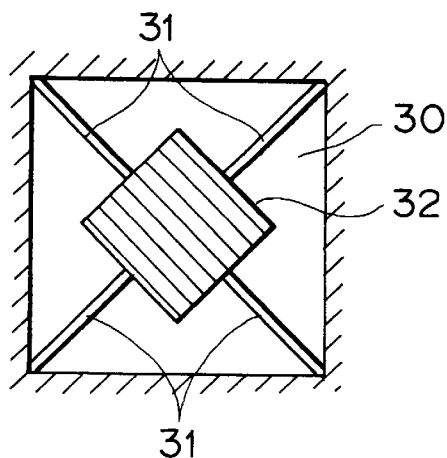

As evident from the foregoing description, the energy which is received by the infrared sensor is determined by the radiant efficiency and temperatures of an object and an infrared radiation receiving portion of a sensor. Therefore, by measuring the substrate temperature of the sensor chip by the thermistor film 10 on the sensor chip and also by obtaining the infrared radiation incident energy from the bridge output caused by the infrared radiation incident on the infrared radiation receiving portion which constitutes the bridge circuit, the temperature of an object can be known. FIGS. 10 and 11 show examples of a temperature measuring circuit employing the infrared sensor of the present invention, respectively.

The infrared sensor of the present invention is installed near an object to be measured, and by the infrared radiation incident on the infrared sensor, the four thermistors on the sensor chip constituting a Wheatstone bridge circuit output a signal corresponding to the incident infrared radiation quantity. An embodiment of the sensor circuit is shown in FIG. 9. As shown in the figure, an output voltage (infrared radiation output signal) $V_A$ is output from the bridge circuit, and an output voltage (sensor temperature output signal) VB from the thermistor film 10 is input. As shown in FIG. 10, the output signal $V_A$ of the bridge circuit is input to a differential amplifier $A_1$ and amplified. The output signal of the differential amplifier $A_1$ is input to an anti-aliasing filter $F_1$ consisting of a low pass filter to filter out a noise component and then is input to a sample and hold circuit $H_1$ and an A/D conversion circuit $CV_1$. The output signal $V_A$ is converted to a digital signal by the A/D conversion circuit $CV_1$. On the other hand, the output voltage (sensor temperature output signal) $V_B$, which is the signal of the substrate temperature of the sensor chip, is amplified by a differential amplifier $A_2$. As with the aforementioned, the output voltage $V_B$ is input to an anti-aliasing filter $F_2$, a sample and hold circuit $H_2$, and an A/D conversion circuit $CV_2$ and is converted to a digital signal. In a digital signal processor (DSP) or central processing unit (CPU) connected to the A/D conversion circuits $CV_1$ and $CV_2$, the relational expression between the output signal voltage $V_A$ of the infrared detector and the sensor temperature output signal $V_B$ (which is the temperature of the sensor chip) is prestored on ROM (not shown). With this relational expression, the temperature $T_B$ of an object is computed based on the outputs of the A/D conversion circuits $CV_1$ and $CV_2$, and the computed temperature is output to a display section D.

From experimental results, the relational expression of the temperature $T_B$ of an object can be approximated as follows:

$$T_B = f(V_B) \cdot V_C^3 + g(V_B) \cdot V_C^2 + h(V_B) \cdot V_C + i(V_B) \tag{3}$$

where $V_C$ is the infrared radiation output voltage and $V_B$ is the output voltage of the substrate temperature.

Therefore, by loading the aforementioned approximated expression (3) into the DSP or CPU and computing the temperature $T_B$ of an object by approximate expression (3), the temperature of an object can be detected with a high degree of accuracy and displayed on the display section.

In the aforementioned infrared detector, the thermal loss of the infrared radiation receiving portion, raised in temperature by incidence of infrared radiations, arises through air in addition to thermal dissipation from beam portions. Therefore, in mounting the sensor chip in a package, if the infrared radiation receiving portion is surrounded in order to make the thermal dissipation of the infrared radiation receiving portion smaller by gas whose heat conductivity is small, such as Xe gas and Kr gas, it will be possible to further enhance the output. Also, the same advantage is obtainable by making the pressure of the package negative instead of employing the aforementioned gas whose heat conductivity is small.

Figure 14A:
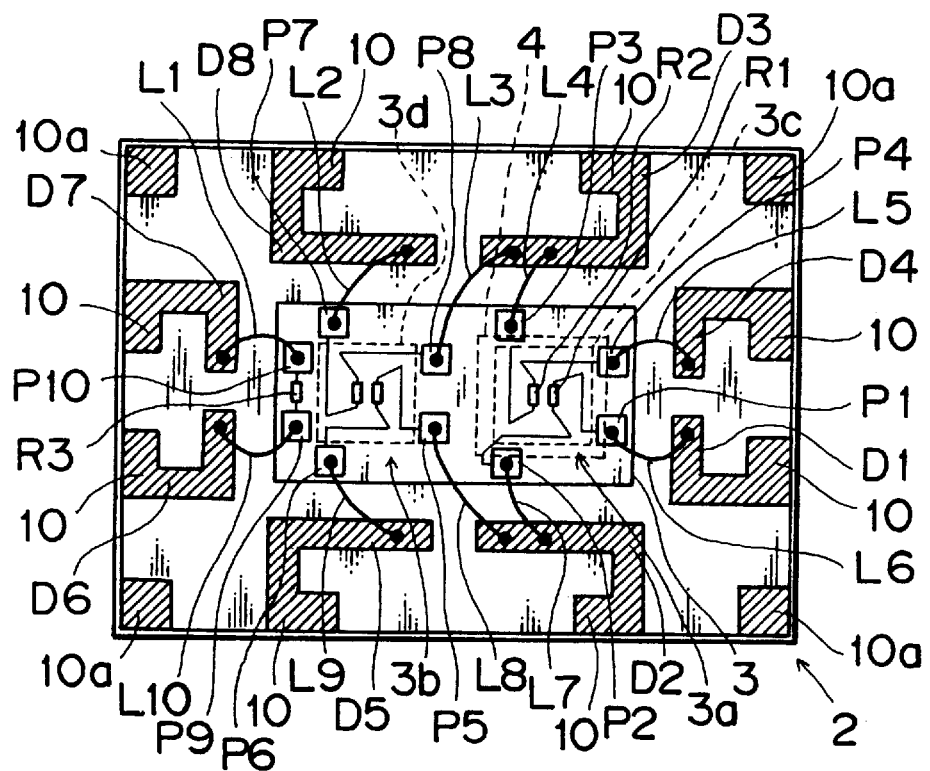
FIG. 14A is a rear view of the infrared sensor chip of FIG. 13B, the infrared sensor chip being provided with a temperature compensation element.
Figure 14B:
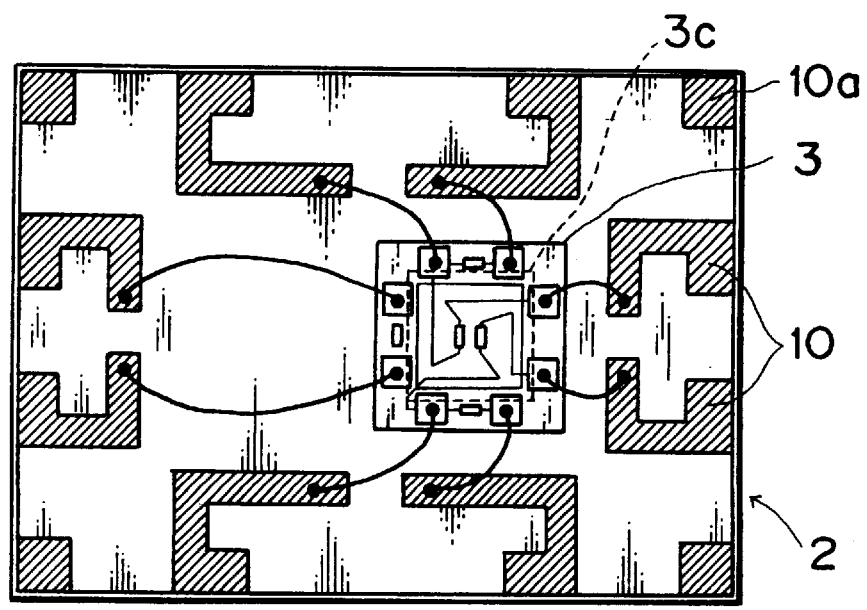
FIG. 14B is a rear view showing another embodiment of the infrared sensor chip shown in FIG. 14A, the infrared sensor chip being a single type.

FIG. 13A is a perspective view showing a fourth embodiment of the infrared sensor of the present invention. FIG. 13B is a sectional view of a cap with an infrared sensor chip, and FIG. 13C is the X—X' cross section of FIG. 13A. FIG. 14 is a rear view of the cap having this infrared sensor chip mounted thereon. FIG. 14A shows the infrared sensor chip provided with a temperature compensation element, and FIG. 14B shows a single infrared sensor chip where only an infrared radiation receiving portion is constituted by an infrared sensor chip. Note that the infrared sensor chip is nearly the same as the infrared sensor chip of the aforementioned embodiment of the present invention and the fabrication method is also the same as the aforementioned fabrication method.

In FIG. 13A the infrared sensor of this embodiment has a structure where a ceramic package 1 is sealed with a cap 2 comprising a silicon substrate on which an infrared sensor chip is mounted. An infrared radiation reflection film 7 with a window 4 through which infrared radiations are transmitted is formed on the cap 2. The ceramic package 1 has electrode terminals 6 formed thereon. The gap between the cap 2 and the ceramic package 1 is filled with a filler, such as epoxy resin, in order to enhance airtightness.

FIG. 13B illustrates the cap 2 having the infrared sensor chip mounted thereon, and the cap 2 is constituted by a silicon substrate. The infrared radiation reflection film 7 is formed on the front surface of the silicon substrate. The silicon substrate is exposed to a region (hereinafter referred to as a window) 4 of the infrared radiation reflection film 7 through which infrared radiations are transmitted. The window 4 may have an infrared radiation antireflection film formed thereon. Around the window 4, the infrared radiation reflection film 7 made of gold (Au) and the like is formed to shield infrared radiations. On the rear surface of the cap 2 the infrared sensor chip 3 is mounted. There is formed an insulating film 8 on the rear surface of the cap 2, and the infrared sensor chip 3 is bonded to the insulating film 8. Also, a buffer film 9a, an electrode underlying layer 9b, an electrode layer 9c, and a bump electrode 10 are formed in sequence on the metal film 8. The infrared sensor chip 3 is bonded to the metal film 8. The pad electrode of the infrared sensor chip 3 and the pad electrode 9c are connected together with a bonding wire 11.

FIG. 13C is a sectional view showing the state of the ceramic package 1 sealed with the cap 2 having the infrared sensor chip 3 mounted on the rear surface. The electrode terminal 6 of the ceramic package 1 is connected electrically to a terminal electrode film 6a. The bump electrode 10 on the rear surface of the cap 2 and the terminal electrode film 6a are bonded together at a temperature higher than the temperature of solder that is used when the infrared sensor chip is mounted on the substrate. It is preferable that the material of the ceramic package 1 be material having a large thermal conductivity, such as alumina and aluminum nitride (AlN). The bump electrode 10 comprises a normal multilayer film such as an Au/Ni/Cr film. After the bump electrode 10 of the cap 2 is connected electrically to the terminal electrode film 6a formed on the ceramic package 1, epoxy resin is poured into the gap between the ceramic package 1 and the cap 2 and is hardened. When the ceramic package 1 is sealed with the cap 2, it is preferable to pour dry air (or dry nitrogen) and inactive gas (such as Xe gas and Kr gas). The present invention is not limited to epoxy resin. For example, solder may be employed by making use of low melting-point glass, a multilayer film (such as an Au/Ni/Cr film), or a underlying metal layer (such as a Cr/Ti layer). With this structure, heat can be easily transferred between the ceramic package 1 and the cap 2 and the surrounding temperature of the infrared sensor can be made uniform, so accurate temperature detection becomes possible.

FIG. 14A is a rear view of the cap 2 and illustrates the state of the infrared sensor chip 3 mounted on the rear surface of the cap 2. Describing in reference to FIG. 14A, there are formed bump electrodes 10 and electrode layers D1 through D8 (electrode layers 9c in FIG. 13) on the rear surface of the cap 2. The bump electrodes 10 are formed on the peripheral edge portions of the cap 2 of the electrode layers D1 through D8. Bump electrodes 10a equivalent to the bump electrodes 10 are formed at the four corners of the rear surface of the cap 2. The bump electrodes 10a are formed for the purpose of bonding and the purpose of grounding the cap 2. The bump electrodes 10a are brought into ohmic contact with the silicon cap and that into contact with the terminal electrode film 6a formed in the package to provide a sealing effect by way of grounding the cap when the infrared sensor chip is mounted on the substrate. In the infrared sensor chip 3, thermosensible elements are formed on the silicon substrate and have a micro air bridge structure, where cavities 3c and 3d are, just under the thermal sensitive portions 3a and 3b. In the micro air bridge structure, L-shaped openings (not shown), for example, are formed so that the heat, accumulated in the thermal sensitive portions 3a and 3b, are not dissipated. The thermal sensitive portion 3a has thermistor films R1 and R2 formed thereon. The electrode of the thermistor film R1 is connected to pad electrodes P1 and P2, and the electrode of the thermistor film R2 is connected to pad electrodes P3 and P4. Similarly, the thermal sensitive portion 3b has two thermistor films formed thereon, and the electrodes of the respective thermistor films are connected to pad electrodes. Then, pad electrodes P1 through P10 are connected to electrode layers D1 through D8 with bonding wires L1 through L10, as shown in FIG. 14. The thermal sensitive portion 3a is a detecting portion which receives infrared radiations incident on the window 4, while the thermal sensitive portion 3b is a thermal sensitive portion for temperature compensation where incidence of infrared radiations is shielded. Each of the thermal sensitive portions 3a and 3b has two elements formed thereon, and these elements form a bridge structure so that an output voltage is obtained. In this connection method, an output is obtained by the circuit connecting method disclosed in Japanese Patent Application No. HEI 8-1551144.

The temperature detection characteristics will be described in reference to FIG. 15.

Figure 15A:
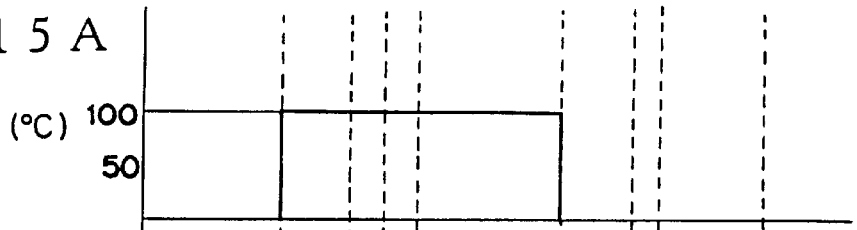
FIGS. 15A through 15G are waveform diagrams showing the operating characteristics of the infrared sensor of FIG. 13A.
Figure 15B:
Figure 15C:
Figure 15D:
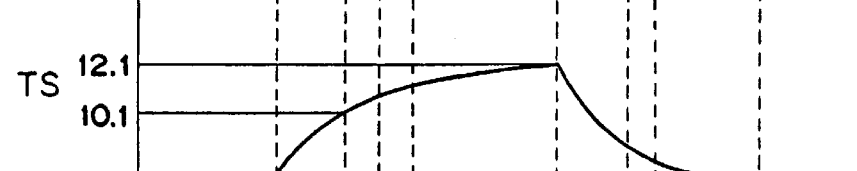
Figure 15E:
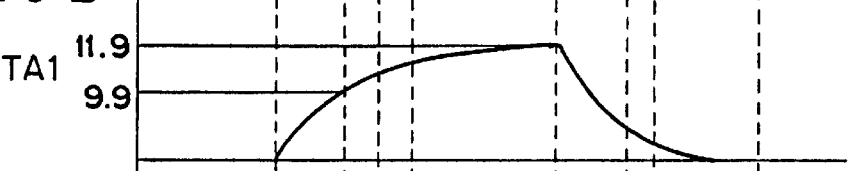
Figure 15F:
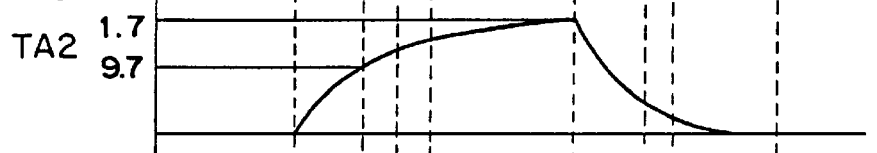
Figure 15G:
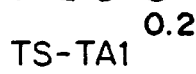

FIG. 15A shows the temperature of a heat source, an experiment is implemented by applying a heat of 100° C. onto the infrared sensor for 100 second by opening a shutter. A time required for increasing a temperature at the infrared sensor up to 100° C. is about 5 ms. FIG. 15B shows the temperature of the package, FIG. 15C the temperature of the window 4, and FIG. 15D the temperature of the infrared radiation receiving portion 3a. FIG. 15E shows the temperature of the bridge compensating portion (i.e., the temperature of the thermal sensitive portion 3 which is a thermosensible temperature compensating portion). FIG. 15F shows the temperature of a substrate compensating portion (i.e., the substrate temperature of the infrared sensor chip), and FIG. 15G shows the voltage of the sensor output.

The temperature of each part of the infrared sensor, as shown in FIG. 15, is influenced by the heat from a heat source and gradually rises. Each part has time dependency for a certain difference of temperature due to the individual thermal capacities and thermal resistance components. The infrared radiation receiving portion is influenced by the surrounding temperature of the infrared radiation receiving portion and responds at high speeds, because the infrared radiation receiving portion has a micro air bridge structure whose thermal capacity is very small. Since the rise times in temperature differ between the infrared radiation receiving portion and the temperature compensating portion and the rise time in temperature of the infrared radiation receiving portion is earliest, the temperature of the heat source can be detected nearly instantly. The thermal influence on the infrared radiation receiving portion is roughly grouped into a temperature component which depends on a package and a component which is influenced directly by a heat source. While the influence of the temperature depending on a package is slow in time, the infrared radiation receiving portion instantly responds. Therefore, by canceling the influence of the thermosensible element for temperature compensation, the influence of the heat from a heat source can be detected at high speed and accurately.

Figure 16A:
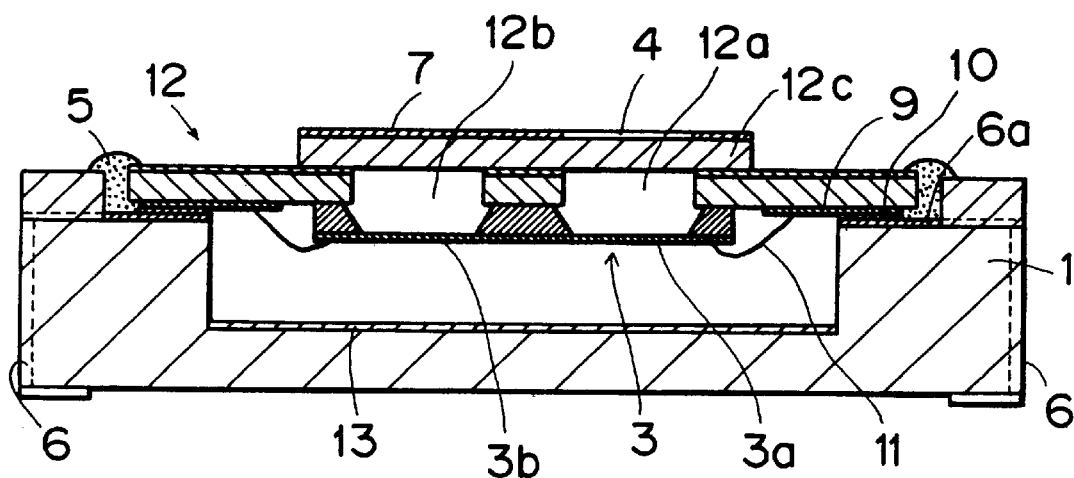
FIG. 16A is a sectional view showing a fifth embodiment of the infrared sensor of the present invention.
Figure 16B:
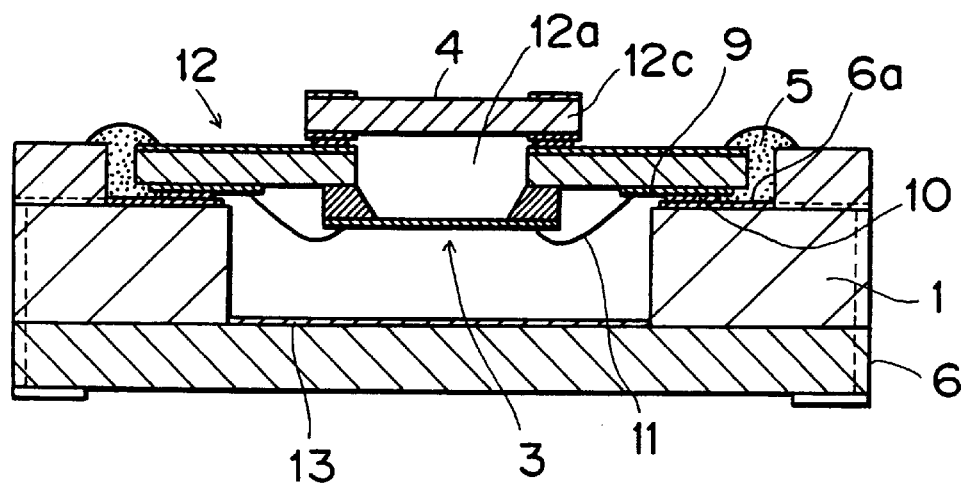
FIG. 16B is a sectional view showing the fifth embodiment of the infrared sensor using a single infrared sensor chip.

FIG. 16A is a sectional view showing a fifth embodiment of the infrared sensor according to the present invention, and FIG. 16B illustrates the case where the infrared sensor uses a single infrared sensor chip.

In FIG. 16A, a ceramic package 1 is sealed with a cap 12 having an infrared sensor chip 3 mounted thereon. At the back side of the cap 12, there is formed an electrode layer 9 which functions as a wiring. The bump electrode 10 is then provided on the electrode layer 9 for providing the ohmic contact between the bump electrode 10 and the terminal electrode film 6a. The cap 12 is provided with openings 12a and 12b and also is provided with a filter plate 12c comprising of a silicon substrate which seals the openings 12a and 12b. To shield infrared radiations, an infrared radiation reflection film 7 is formed on the filter plate 12c except a window 4. Infrared rays, therefore, are transmitted through the window 4 not covered with the infrared radiation reflection film 7. An infrared sensor chip 3 consisting of thermal sensitive portion 3a and 3b is disposed so that the infrared radiations, incident on the window 4, pass through the opening 12a and are received by the thermal sensitive portion 3a, while the thermal sensitive portion 3b is disposed on the side of the infrared radiation reflection film 7 where infrared radiations are shielded. The silicon substrate 12c is provided so as to cover the openings 12a and 12b formed in the cap 2. Although not needed at all times, an infrared radiation reflecting film 13 is provided on the bottom of the housing portion of the ceramic package 1 so that the infrared radiations, transmitted through the thermal sensitive portions 3a and 3b, are reflected. In this embodiment, the main body of the cap 12 is formed of ceramic material, so the infrared sensor is superior in mechanical strength to the aforementioned embodiment shown in FIG. 13A. For infrared radiation detection, the same infrared radiation detection characteristics as the embodiment of FIG. 13A is obtainable. The infrared sensor chip 3 is the same as that described in FIG. 14A.

Figure 17A:
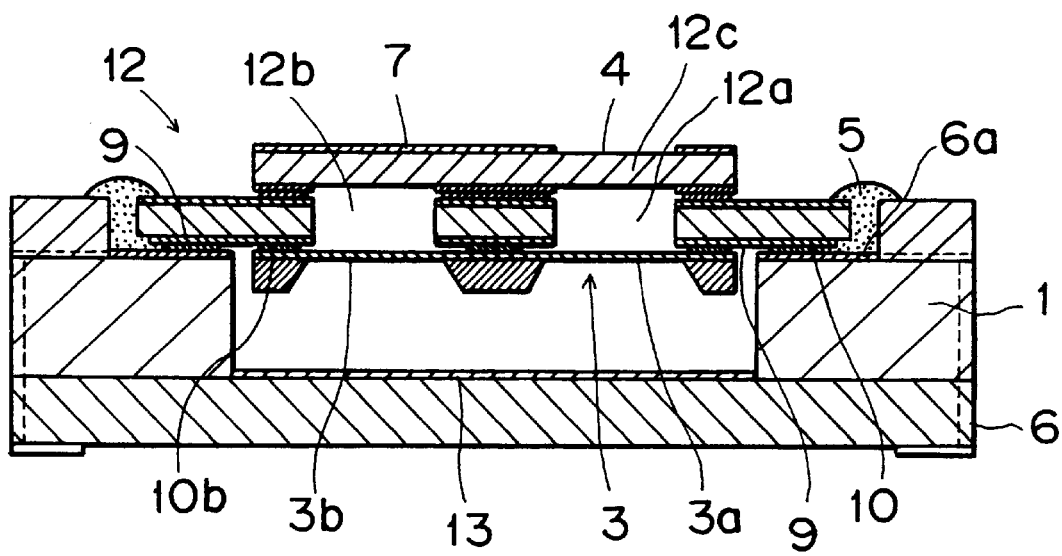
FIG. 17A is a sectional view showing a sixth embodiment of the infrared sensor of the present invention.
Figure 17B:
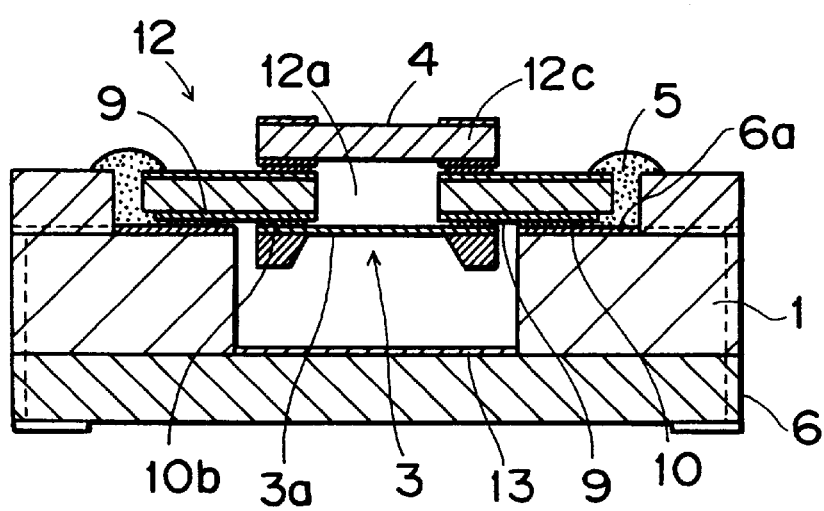
FIG. 17B is a sectional view showing the sixth embodiment of the infrared sensor using a single infrared sensor chip.

FIGS. 17A and 17B are sectional views showing a sixth embodiment of the infrared sensor of the present invention. This embodiment is similar to the embodiment shown in FIG. 16A, however an infrared sensor chip 3 is bonded at a surface opposite to that of the embodiment of FIG. 16A. More particularly, by face-down bonding the infrared sensor chip 3 to the rear surface of the cap 12, respective bump electrodes 10b formed on the infrared sensor chip 3 are brought into ohmic contacted with electrode layers 9 formed on the rear surface of a cap 12, through said face-down bonding.

The openings 12a and 12b formed in the cap 12 are covered with a filter plate 12c consisting of a silicone substrate on which an infrared radiation reflecting layer 7 is provided except the window 4. The cap 12, which is provided with infrared sensor chip 3 at its rear surface and the filter plate 12c on its front surface, is facedown bonded onto the opening of the ceramic package 1 so that the bump electrode 10 formed at the rear surface of the cap 12 is brought into ohmic contact with terminal electrode film 6a of the ceramic package 1. Therefore, there is no need to use bonding wires to provide the electrical connection therebetween. In addition, the number of processing steps is reduced and this structure is strong against mechanical vibrations.

FIG. 17B shows a sectional view of the sixth embodiment of the infrared sensor of the present invention, and the infrared sensor chip 3 uses a single infrared sensor chip. The structure other than the infrared sensor chip 3 is similar to that of FIG. 17A and therefore a detailed description is omitted.

Figure 18A:
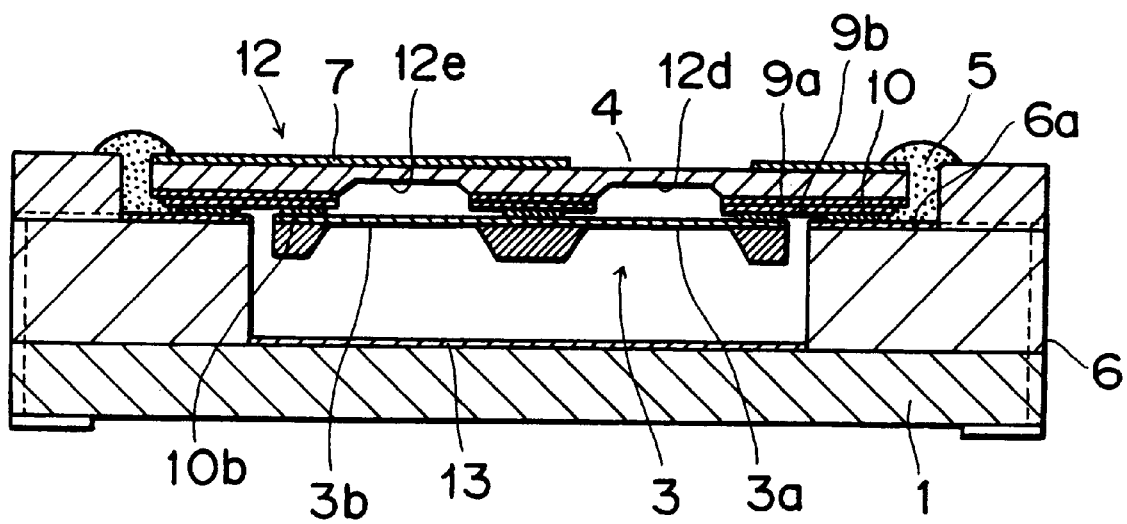
FIG. 18A is a sectional view showing a seventh embodiment of the infrared sensor of the present invention.
Figure 18B:
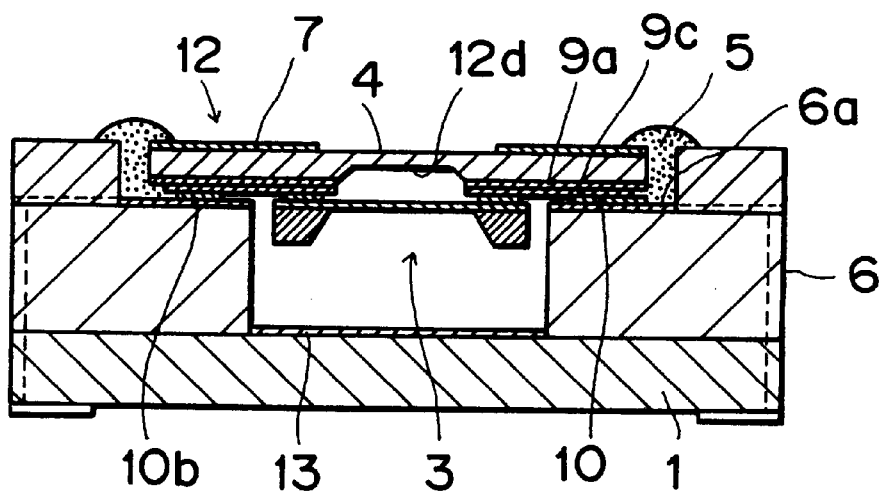
FIG. 18B is a sectional view showing the seventh embodiment of the infrared sensor using a single infrared sensor chip.

FIGS. 18A and 18B are sectional views showing another embodiment of the infrared sensor of the present invention. In FIG. 18A the infrared sensor comprises a ceramic package 1 and a cap 12 which also acts as an infrared radiation filter.

An infrared sensor chip 3 is bonded to the cap 12 with its face down and therefore bump electrodes 10b and electrode layers 9c are brought into ohmic contact with each other. The cap 12 is constituted by a silicon substrate which transmits infrared radiations, and cavities 12d and 12e are formed in the portion of the silicon substrate where corresponds to the thermal sensitive portions 3a and 3b of the infrared sensor chip 3. An infrared radiation reflecting film 7 is formed on the front surface of the cap 12 except the window 4. Ground electrode layers 9a are formed on the rear surface of the cap 12, and then electrode layers 9c which are wiring layers are formed on the underlying electrode layers 9a. The bump electrodes 10b of the infrared sensor chip 3 are brought into ohmic contact with these electrode layers 9c. Therefore, there is no need to use bonding wires to electrically connect the bump electrodes 10b and the electrode layers 9c together. In addition, the number of processing steps is reduced and this structure is strong against mechanical vibrations.

FIG. 18B shows a sectional view of another embodiment of the infrared sensor of the present invention, and the infrared sensor chip 3 uses a single infrared sensor chip. The structure other than the infrared sensor chip 3 is similar to that of FIG. 18A and therefore a detailed description is omitted.

Figure 19A:
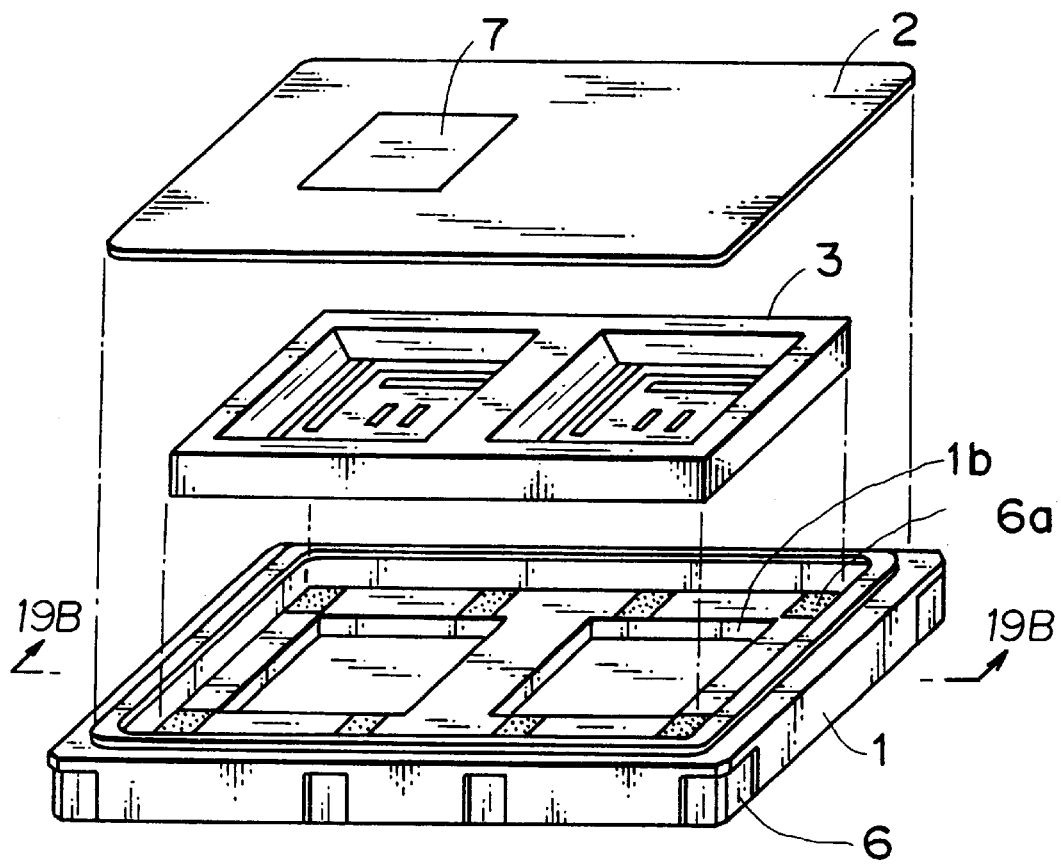
FIG. 19A is an exploded perspective view showing an eighth embodiment of the infrared sensor of the present invention.
Figure 19B:
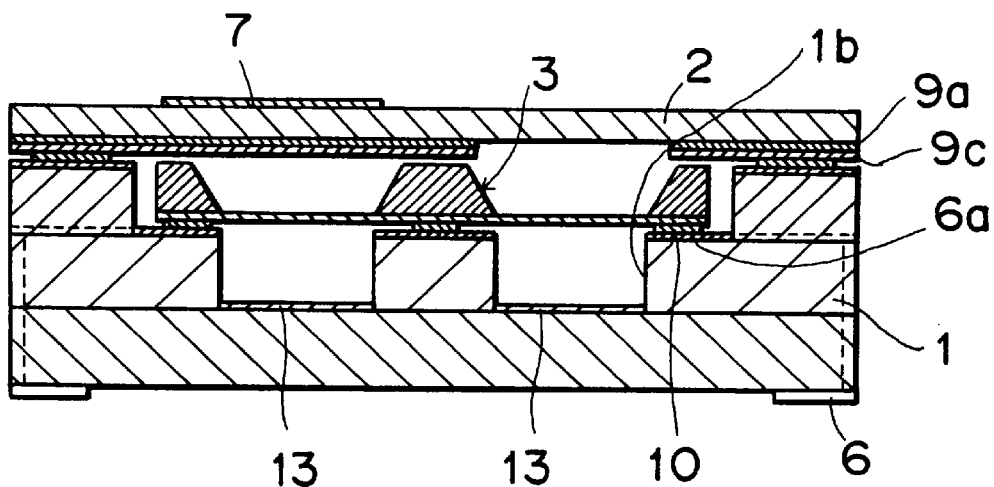
FIG. 19B is a sectional view taken substantially along line X—X' of FIG. 19A when the infrared sensor is assembled.
Figure 20:
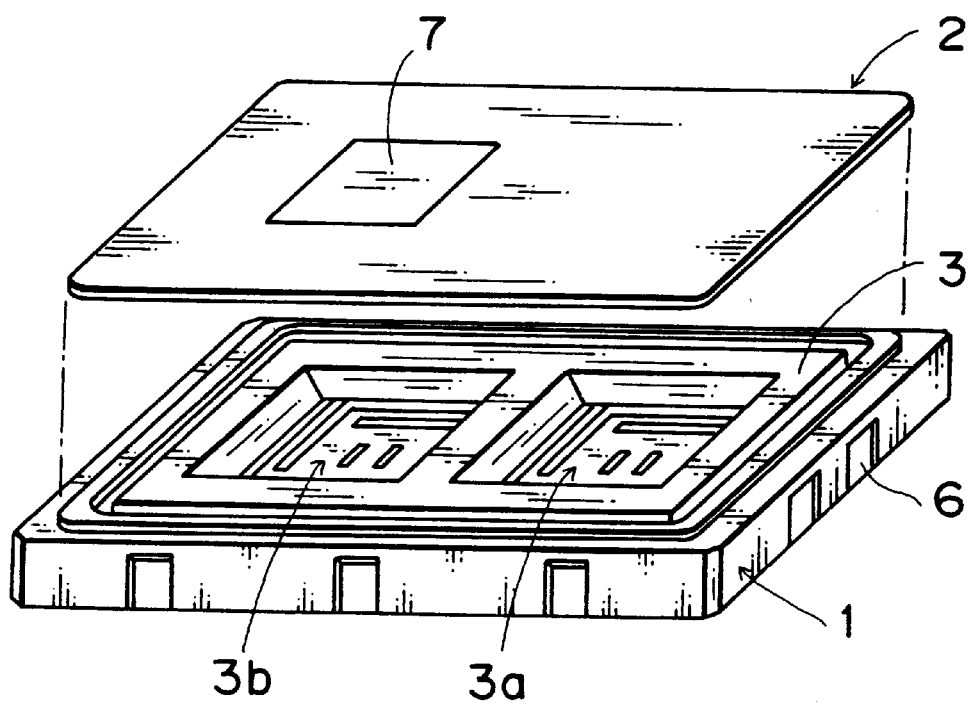
FIG. 20 is a perspective view showing the infrared sensor chip housed in the ceramic package.
Figure 21:
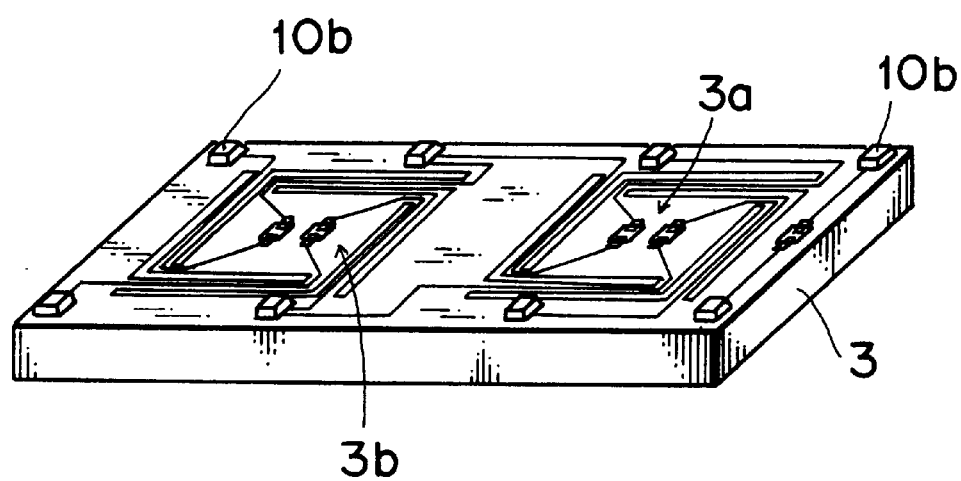
FIG. 21 is a perspective view showing the infrared sensor chip of FIG. 19.

FIGS. 19 through 21 illustrate still another embodiment of the infrared sensor of the present invention. FIG. 19A is an exploded perspective of the infrared sensor, and FIG. 19B is a sectional view taken substantially along line X—X' of FIG. 19A when the infrared sensor is assembled. FIG. 20 is a perspective of the infrared sensor chip housed in the ceramic package. FIG. 21 is a perspective view of the infrared sensor chip, and a bump electrode is formed on the front end of a conductive layer.

As shown in FIG. 19, this embodiment comprises a ceramic package 1, a cap 2, and an infrared sensor chip 3. The bottom portion of the ceramic package 1 is formed with terminal electrode layers 6a connected to the terminal electrodes 6 and, at the bottom portion of the infrared sensor chip 3, there are formed recess portions 1b in order to make the thermal resistance large. Further, at each bottom of the recess portions 1b, there is formed an infrared radiation reflecting film 13. The bump electrodes 10, formed on the infrared sensor chip 3, are connected electrically to the terminal electrode layers 6a by bonding the bump electrodes 10 to the package bottom portion with the faces of the electrodes 10 down. The infrared sensor chip 3 is housed in the ceramic package 1 and sealed with the cap 2. The upper surface of the housed infrared sensor chip 3 is nearly coplanar with the upper surface of the ceramic package 1. This structure is essentially the same as a structure where the infrared sensor chip 3 is bonded to the rear surface of the cap 2. The cap 2 is formed of a silicon substrate, and an infrared radiation reflection film 7 such as a gold (Au) film, which reflects infrared radiations, is formed on the cap 2. The silicon substrate of the cap 2 other than the infrared radiation reflection film 7 being provided is exposed. Just under the infrared radiation reflection film 7, a thermal sensitive portion 3b for temperature compensation is disposed. Since the infrared radiation reflection film 7 is not formed on the cap 2 just above a thermal sensitive portion 3a, the silicon substrate is exposed.

The configuration of the infrared sensor chip 3, as shown in FIG. 21, is nearly the same configuration as FIG. 14, and a thermal sensitive portion 3a for receiving infrared radiations and a thermal sensitive portion 3b for temperature compensation are formed. The thermal sensitive portions 3a and 3b are formed from thermistor films, and the electrodes of the thermistor films are connected to bump electrodes 10b. These bump electrodes 10b are connected electrically to terminal electrode layers 6a of the ceramic package 1 by thermal fusion with a face-down bonging method for providing ohmic contact.

Figure 22A:
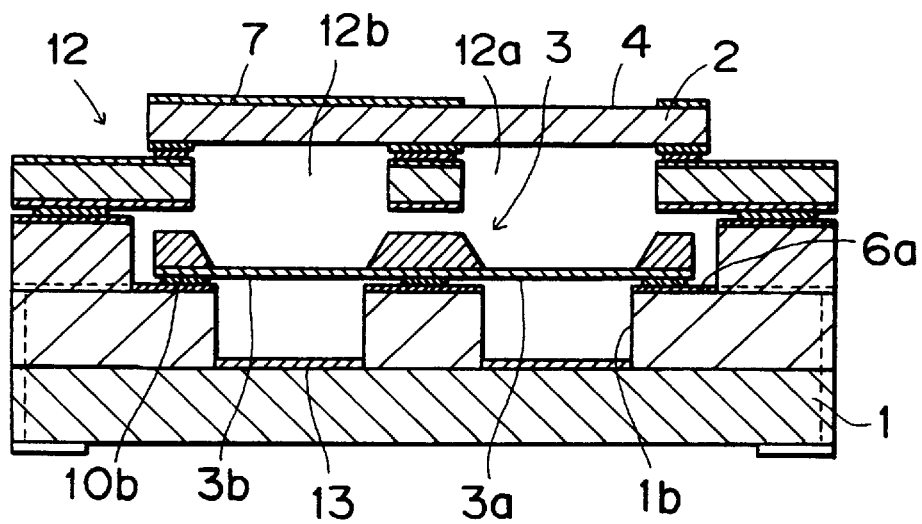
FIG. 22A is a sectional view showing a ninth embodiment of the infrared sensor of the present invention.
Figure 22B:
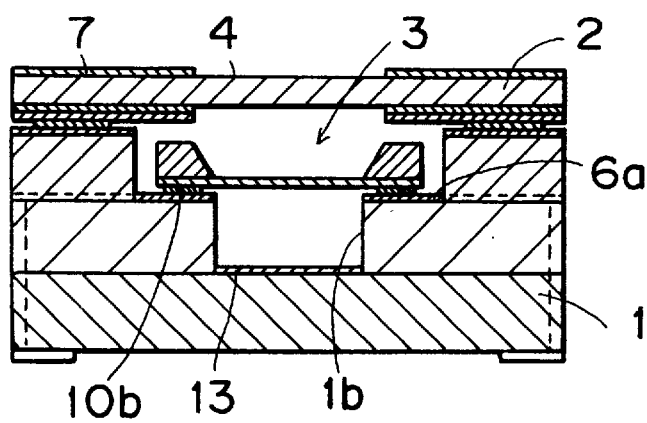
FIG. 22B is a sectional view showing the ninth embodiment of the infrared sensor using a single infrared sensor chip.
Figure 22C:
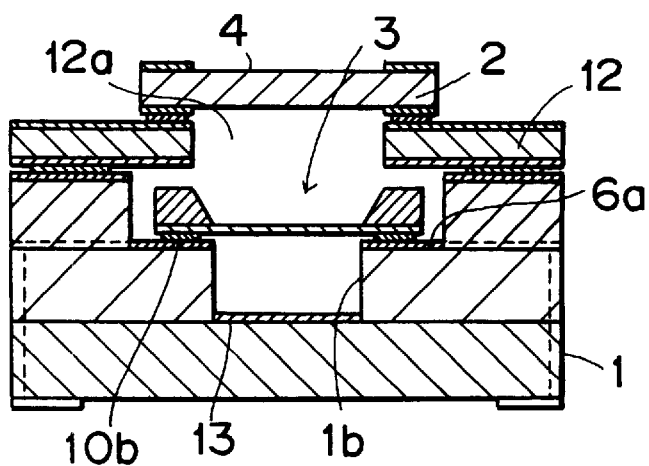
FIG. 22C is a sectional view showing the ninth embodiment of the infrared sensor using a single infrared sensor chip, the ceramic cover being formed with a single opening.
Figure 23:
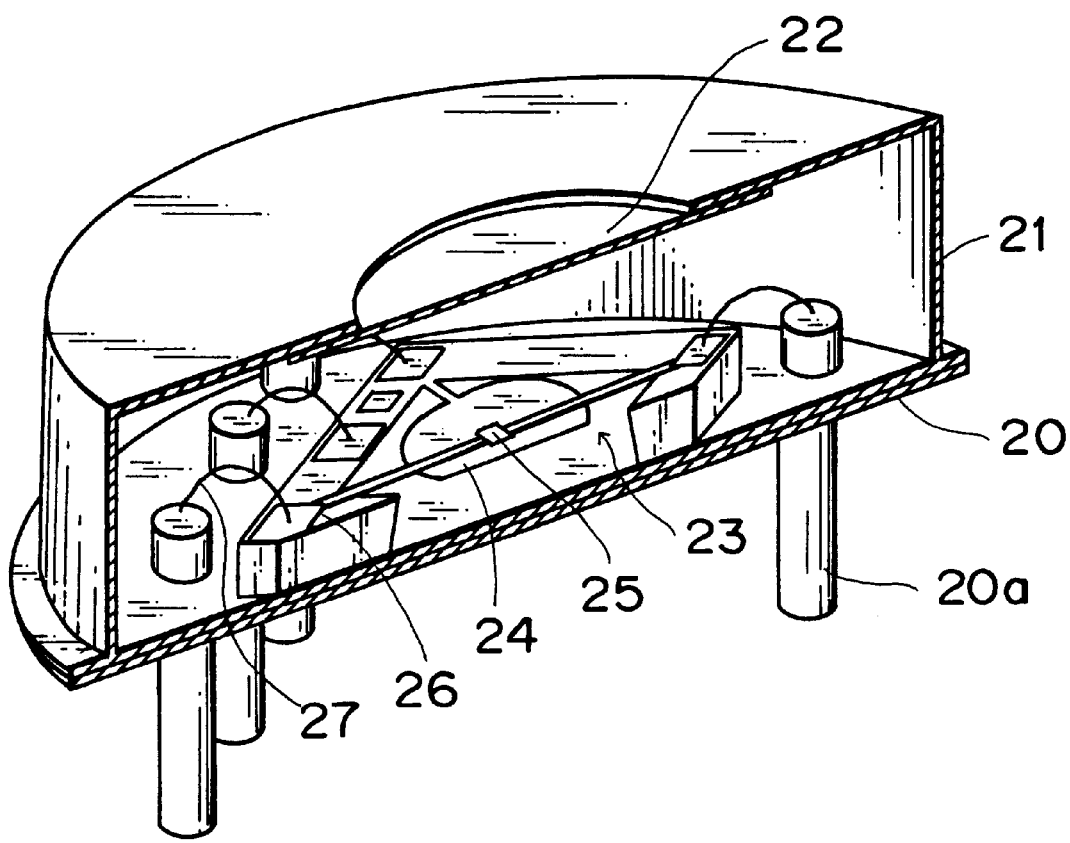
FIG. 23 is a sectional view showing an example of a conventional infrared sensor.

FIGS. 22A through 22C illustrate still another embodiment of the infrared sensor of the present invention.

As shown in FIGS. 22A through 22C, the surface of an infrared sensor chip 3 is faced down and the sensor chip 3 is electrically connected by bonding to the bump electrodes 10b and to the terminal electrode films 6a of the housing portion of a ceramic package 1 to provide ohmic contacts. For thermal insulation, a recess portion 1b is formed in the bottom of the housing portion of the ceramic package. In FIG. 22A, openings 12a and 12b are formed in a ceramic cap 12. A top cap 2 provided a window 4 through which infrared radiations transmit and an infrared reflecting film 7 is disposed so that the openings 12a and 12b are covered. FIG. 22B shows the cap 2 consisting of a silicon substrate which is of an infrared radiation filter and a single infrared sensor chip 3 being installed. FIG. 22C shows the cap 12 where only a single opening 12a is formed. Although not needed at all times in these ceramic package 1, an infrared radiation reflecting film 13 is formed on the bottom of the recess portion 1b.

In the infrared sensors of FIGS. 22A through 22C, the infrared sensor chip 3 is self-aligned with respect to the housing portion of the ceramic package 1, and with the surface down, the infrared sensor chip 3 is bonded to the housing portion of the ceramic package 1, and the bump electrode 10b and terminal electrode films 6b are connected electrically. Consequently, bonding steps employing bonding wires can be eliminated and mechanical strength can be enhanced.

Also, in the embodiments shown in FIGS. 22A through 22C, the cap is bonded to the ceramic package and gaps as in the embodiments of FIG. 13 and FIGS. 16 through 18 are not formed. Consequently, no filler is needed in the embodiments of FIGS. 22A through 22C.

As has been described hereinbefore, the infrared detector of the present invention is constructed so that the beam portion supporting the infrared radiation receiving portion extends in the form of a hook along the cavity of the substrate and the L-shaped opening in the infrared radiation receiving portion, and consequently, the area of the infrared radiation receiving portion can be enlarged in comparison with a conventional structure. In addition, since the effective length of the beam portion can be lengthened, the thermal resistance of the beam portion is increased and therefore the heat conduction from the infrared radiation receiving portion to the substrate can be suppressed. Since the thermal resistance of the beam portion is increased, heat dissipation is reduced and the temperature distribution of the infrared radiation receiving portion become even. For this reason, the respective temperatures of the thermistor films, formed on the infrared radiation receiving portion, reach the same temperature when infrared radiations are incident. Two thermistor films for temperature compensation are formed on the same substrate. Therefore, when the bridge circuit of the infrared detector is constituted by both the thermistor films for infrared radiation detection and the thermistor films for temperature compensation, the temperature of the infrared radiation detecting thermistor films can be effectively raised by incidence of infrared radiations, and the temperature of the sensor can be accurately compensated by the temperature compensation thermistor films which measure surrounding temperature. As a consequence, there is the advantage that the sensor sensitivity can be enhanced in comparison with the aforementioned conventional structure.

Also, as shown in FIG. 6, when one of two infrared radiation receiving portions which are identical in configuration and size is employed as an infrared radiation receiving portion which receives infrared radiations and the other portion is employed as an infrared radiation receiving portion which compensates temperature, the thermal radiation constants of the two infrared radiation receiving portions become the same, and the thermistor films of each infrared radiation receiving portion also reach the same temperature, for the aforementioned reasons. Therefore, a fluctuation in the surrounding temperature can be detected more accurately, and the voltage that is applied to the bridge circuit can be raised. As compared with the aforementioned first embodiment, the output of the infrared detector can be further raised and higher sensitivity temperature detection is achievable.

In addition, according to the infrared sensor and the infrared detector of the present invention, a temperature controller which uses the temperature data of the infrared radiation detecting circuit based on Eq. (3) can be employed for controlling the temperature of the heating roller of the fixing device of a conventional copying machine. With this, the temperature of the roller can be controlled without contact, and the problem of scratches on the controller surface which was problematic in the case of a conventional temperature sensor can be overcome, and consequently, there arises the advantage that an image of high quality is obtainable.

Furthermore, since there is no moving portion such as a chopper which is,required of a conventional non-contact type, i.e., pyroelectric type infrared detector, there is the advantage that no mechanical failure occurs. In addition, there is no possibility that the present invention cannot be used in such a high-temperature portion of the aforementioned fixing device due to the temperature dependency (Curie temperature) of the pyro-electric device. Therefore, there is the advantage that the operating temperature range becomes wider and that the application is extensively expanded.

Moreover, as compared with a thermopile infrared detector, the thermal resistance between the infrared radiation receiving portion and the substrate can be increased from the point of the structure of the infrared detector of the present invention. For this reason, a large output voltage is generated, and consequently, higher sensitivity temperature detection is possible.

In addition, according to the present invention, since an infrared sensor chip is either provided in the cap of a ceramic package or adjacent to the cap, the infrared radiation receiving portion and the temperature compensating portion instantly respond with respect to the heat source. As a consequence, there is the advantage that infrared radiation detection sensitivity is very high.

In accordance with the present invention, because the infrared sensor chip is bonded to the cap by thermal fusion means, positioning is extremely accurately made. As a consequence, there is the advantage that a fluctuation in the detection sensitivity can be minimized.

According to the present invention, a gap is provided between the infrared radiation receiving portion and the ceramic package and between the infrared radiation receiving portion and the cap. Consequently, the thermal resistance is increased and the infrared radiation sensitivity is enhanced. In addition, by making thermal resistance small between the sensor chip, the cap, and the ceramic package and quickly transferring heat between the sensor chip and the temperature compensating portion, temperature compensation can be accurately performed, and consequently, infrared radiation sensitivity can be enhanced.

According to the present invention, the cap is provided with an opening and also is provided with an infrared radiation filter formed from a silicon substrate. Consequently, the mechanical strength of the cap can be enhanced, and by providing bump electrodes in the infrared sensor chip and electrically connecting them to the package, there is the advantage that the sensor chip and the package do not need to be connected together by wire bonding and that the mechanical strength is enhanced.

While the present invention has been described with reference to preferred embodiments thereof, the invention is not to be limited to the details given herein, but may be modified within the scope of the appended claims.

What is claimed is:

1. An infrared sensor chip comprising:
    a substrate formed with a first cavity and a second cavity;
    first infrared radiation receiving portion supported in the form of a micro air bridge in said first cavity by a first set of four hook-shaped beam portions extending from said substrate;
    second infrared radiation receiving portion supported in the form of a micro air bridge in said second cavity by a second set of four hook-shaped beam portions extending from said substrate;
    a first set of thermistor films formed on said first infrared radiation receiving portion;
    a second set of thermistor films formed on said second infrared radiation receiving portion;
    thermistor film arranged on said substrate for detecting temperature of said substrate; and
    an infrared radiation transparent filter arranged above said substrate;
    an infrared radiation antireflection film provided on said infrared radiation transparent film above said first infrared radiation receiving portion; and
    an infrared radiation reflection film provided on said infrared radiation transparent filter above said second infrared radiation receiving portion for shielding said second infrared radiation receiving portion from infrared radiations,
wherein said first infrared radiation receiving portion is used for detecting infrared radiations and said second infrared radiation receiving portion is used for compensating temperature.

2. The infrared sensor chip as set forth in claim 1, wherein said infrared radiation transparent filter is formed from silicon.

3. The infrared sensor chip as set forth in claim 1, wherein said infrared radiation antireflection film comprises ZnS or $SiO_2$ and said infrared radiation reflection film comprises a film of Au or Al metal.

4. An infrared sensor chip comprising:
    a substrate formed with a cavity;
    an infrared radiation receiving portion supported in the form of a micro air bridge in said cavity by a set of four hook-shaded beam portions extending from said substrate;
    a first set of two thermistor films for infrared radiation detection formed on said infrared radiation receiving portion; and
    a second set of two thermistor films for temperature compensation arranged on said substrate.

5. An infrared sensor chip comprising:

a substrate formed with a cavity;

an infrared radiation receiving portion supported in the form of a micro air bridge in said cavity by four hook-shaped beam portions extending from said substrate;

a set of at least two thermistor films for infrared radiation detection formed on said infrared radiation receiving portion;

a set of at least two thermistor films for temperature compensation arranged on said substrate; and a single thermistor film arranged on said substrate for detecting temperature of said substrate.

6. The infrared sensor chip as set forth in any one of claims 1 through 5, wherein each of the sets of thermistor films comprise four thermistor films which are arranged to constitute a bridge circuit;

two of the four thermistor films are disposed on the opposite sides of said bridge circuit to constitute a thermal sensitive portion for infrared radiation detection;

the other two thermistor films are disposed on the remaining opposite sides of said bridge circuit to constitute a thermal sensitive portion for temperature compensation; and a correction of temperature is made with respect to an output of an infrared detector by detecting a change in an output voltage of said bridge circuit caused by infrared radiations incident on the four thermistor films forming said bridge circuit and also by providing a thermistor film for detecting temperature of said substrate.

7. An infrared sensor chip comprising:

a subsrtate formed with a cavity;

an infrared radiation recieving portion supported in the form of a micro air bridge in said cavity by a set four hook-shaped beam portions extending from said substrate;

two thermomistor films for infrared radiation detection formed on said infrared radiation recieving portion; and a single thermistor film arranged on said substrate for detecting temperature of said substrate.

8. The infrared sensor chip as set forth in claim 7, wherein said four hook-shaped beam portions are thinner in thickness than said infrared radiation recieving portion.

9. The infrared sensor chip as set forth in any one of claims 1, 4, 5, and 7, wherein said thermistor films are formed from an oxide of a Mn—Ni—Co system.

10. The infrared sensor chip as set forth in any one of claims 1, 4, 5, and 7 wherein a package in which said substrate is mounted is sealed with negative pressure and/or low thermal conduction gas.

11. An infrared detector comprising:

an infrared sensor constituted by a sensor chip having four thermistor films mounted thereon;

means for amplifying a differential output voltage signal of a bridge circuit constituted by said four thermistor films;

means for detecting temperature of a substrate by a thermistor film provided near said four thermistor films;

means for converting the amplified differential output voltage signal to a digital signal;

means for converting a voltage signal corresponding to the temperature of said substrate to a digital signal;

means for storing an approximate expression which is for computing temperature of an object;

means for computing the temperature of said object from the output voltage signal of said bridge circuit and the voltage signal of the temperature of said substrate by said approximate expression; and means for displaying a result of the computation.

12. An infrared sensor comprising:

an infrared sensor chip; and a ceramic package and a cap formed from silicon for sealing said infrared sensor chip; and wherein:

said infrared sensor chip is provided with a silicon substrate and an infrared radiation receiving portion which is supported in the form of a micro air bridge in a cavity provided in said silicon substrate by a set of four hook-shaped beam portions extending from said substrate;

two thermistor films for detecting infrared radiations are formed on said infrared radiation receiving portion;

a thermistor film for detecting temperature of said substrate is formed on said silicon substrate;

said infrared sensor chip is provided on a rear surface of said cap having electrode layers and is electrically connected to said electrode layers; and an opening of said ceramic package is covered with said cap so that said electrode layers are connected electrically through bump electrodes to terminal electrodes formed on said ceramic package.

13. The infrared sensor as set forth in claim 12, wherein a gap is formed between said ceramic package and said cap and is filled with a filler.

14. An infrared sensor comprising:

an infrared sensor chip; and a ceramic package and a cap formed from silicon for sealing said infrared sensor chip, wherein:

said infrared sensor chip comprises a silicon substrate and an infrared radiation receiving portion which is supported in the form of a micro air bridge in a cavity provided in said silicon substrate by a set of four hook-shaped beam portions extending from said substrate;

two thermistor films for detecting infrared radiations are formed on said infrared radiation receiving portion;

a thermistor film for detecting temperature of said substrate is formed on said silicon substrate;

electrode layers are formed on a rear side of said cap formed with openings;

said infrared sensor chip is provided on a rear side of said cap so as to cover said openings formed in said cap;

said silicon substrate being formed an infrared radiation transmitting region and an infrared radiation shielding region is mounted on the front side of said cap so as to cover said openings formed in said cap; and an opening of said ceramic package is covered with said cap so that said electrode layers are connected electrically through bump electrodes to conductive layers connected to terminal electrodes formed on said ceramic package.

15. An infrared sensor comprising:

an infrared sensor chip; and a ceramic package and a cap formed from silicon for housing said infrared sensor chip, wherein:

said infrared sensor chip comprises a silicon substrate, a cavity provided in said silicon substrate, and an infrared radiation receiving portion which is supported in the form of a micro air bridge in said cavity by a set of four hook-shaped beam portions extending from said substrate;

two thermistor films for detecting infrared radiations are formed on said infrared radiation receiving portion;

a thermistor film for detecting temperature of said substrate is formed on said silicon substrate; and bump electrodes on said infrared sensor chip are connected electrically to conductive layers formed in said ceramic package and then said cap is provided in said ceramic package.

16. An infrared sensor comprising:

an infrared sensor chip;

a ceramic package; and a cap formed from silicon with a cavity in its rear surface, wherein:

with a surface of said infrared sensor chip down, said infrared sensor chip is bonded to conductive layers formed on the rear surface of said cap so that said cavity is aligned with thermal sensitive portions of said infrared sensor chip;

said infrared sensor chip comprises a silicon substrate, a cavity provided in said silicon substrate, and an infrared radiation receiving portion supported in the form of a micro air bridge in said cavity by a set of four hook-shaped beam portions extending from said substrate;

two thermistor films for detecting infrared radiations and a thermistor film for detecting temperature of said substrate are formed on said infrared radiation receiving portion; and said conductive layers, connected electrically to said infrared sensor chip, are connected electrically to terminal electrode formed on said ceramic package.

17. An infrared sensor comprising:

an infrared sensor chip;

a ceramic package; and a cap formed from silicon with an opening, wherein:

with a surface of said infrared sensor chip down, said infrared sensor chip is bonded to a rear surface of said cap so that said opening is covered;

a filter plate is provided so that a surface of said filter plate covers said opening;

said infrared sensor chip comprises a silicon substrate, a cavity provided in said silicon substrate, and an infrared radiation receiving portion supported in the form of a micro air bridge in said cavity by a set of four hook-shared beam portions extending from said substrate;

two thermistor films for detecting infrared radiations and a thermistor film for detecting temperature of said substrate are formed on said infrared radiation receiving portion; and conductive layers, connected electrically to said infrared sensor chip, are connected electrically to terminal electrode formed on said ceramic package through bump electrodes.

* * * * *